United States Patent
Ozawa

(10) Patent No.: US 11,121,649 B2
(45) Date of Patent: Sep. 14, 2021

(54) ELECTROSTATIC WORKPIECE-HOLDING METHOD AND ELECTROSTATIC WORKPIECE-HOLDING SYSTEM

(71) Applicant: CREATIVE TECHNOLOGY CORPORATION, Kawasaki (JP)

(72) Inventor: Masaru Ozawa, Kawasaki (JP)

(73) Assignee: CREATIVE TECHNOLOGY CORPORATION, Kawasaki (JP)

( * ) Notice: Subject to any disclaimer, the term of this patent is extended or adjusted under 35 U.S.C. 154(b) by 0 days.

(21) Appl. No.: 16/638,614

(22) PCT Filed: Jul. 25, 2018

(86) PCT No.: PCT/JP2018/027849
§ 371 (c)(1),
(2) Date: Feb. 12, 2020

(87) PCT Pub. No.: WO2019/044290
PCT Pub. Date: Mar. 7, 2019

(65) Prior Publication Data
US 2020/0177108 A1 Jun. 4, 2020

(30) Foreign Application Priority Data

Aug. 28, 2017 (JP) .............................. JP2017-163798
Dec. 14, 2017 (JP) .............................. JP2017-239200

(51) Int. Cl.
*H01L 21/683* (2006.01)
*H02N 13/00* (2006.01)
*H01L 21/677* (2006.01)
*H01T 23/00* (2006.01)
*H01L 21/67* (2006.01)

(52) U.S. Cl.
CPC .......... *H02N 13/00* (2013.01); *H01L 21/683* (2013.01); *H01L 21/6833* (2013.01);
(Continued)

(58) Field of Classification Search
CPC ... H02N 13/00; H01L 21/683; H01L 21/6833; H01L 21/6836; H01L 21/6704; H01L 21/67742; H01T 23/00
(Continued)

(56) References Cited

U.S. PATENT DOCUMENTS 5,001,594 A * 3/1991 Bobbio .............. H01L 21/6831
361/230
5,894,400 A * 4/1999 Graven .................. H02N 13/00
361/234
(Continued)

FOREIGN PATENT DOCUMENTS

JP  H05-315429 A  11/1993
JP  H08-083832 A  3/1996
(Continued)

OTHER PUBLICATIONS

PCT/ISA/210, "International Search Report for International Application No. PCT/JP2018/027849," dated Oct. 23, 2018.
(Continued)

*Primary Examiner* — Danny Nguyen
(74) *Attorney, Agent, or Firm* — Manabu Kanesaka

(57) ABSTRACT

An electrostatic workpiece-holding method includes an initialization step, a static elimination step, a workpiece setting step, a workpiece attracting step, and a workpiece release step. The initialization step is a step of applying a positive voltage to electrode of the electrostatic attracting part while applying a negative voltage to electrode. The static elimination step is a step of removing the static charge on the surface of the electrostatic attracting part. The workpiece setting step is a step of placing the workpiece in contact with the surface of the electrostatic attracting part. The workpiece attracting step is a step of interrupting the application of the positive voltage to electrode of the electrostatic attracting part and the application of the negative voltage to electrode.
(Continued)

The workpiece release step is a step of applying the positive voltage to electrode of the electrostatic attracting part while applying the negative voltage to electrode.

15 Claims, 17 Drawing Sheets

(52) U.S. Cl.
CPC ...... *H01L 21/6836* (2013.01); *H01L 21/6704* (2013.01); *H01L 21/67742* (2013.01); *H01T 23/00* (2013.01)

(58) Field of Classification Search
USPC .......................................................... 361/234
See application file for complete search history.

(56) References Cited

U.S. PATENT DOCUMENTS

| | | | |
|---|---|---|---|
| 7,821,767 B2 | 10/2010 | Fujii | |
| 2005/0047057 A1* | 3/2005 | Kwon | H01L 21/6833 |
| | | | 361/234 |
| 2008/0037196 A1 | 2/2008 | Yonekura et al. | |
| 2009/0109595 A1* | 4/2009 | Herchen | H01L 21/6831 |
| | | | 361/234 |
| 2011/0102965 A1* | 5/2011 | Fujisawa | H01L 21/6833 |
| | | | 361/234 |

FOREIGN PATENT DOCUMENTS

| | | |
|---|---|---|
| JP | H09-036212 A | 2/1997 |
| JP | 2000-348659 A | 12/2000 |
| JP | 2003-282671 A | 10/2003 |
| JP | 2006-049391 A | 2/2006 |
| JP | 2008-041993 A | 2/2008 |
| WO | 2006/049085 A1 | 5/2006 |
| WO | 2016/167224 A1 | 10/2016 |

OTHER PUBLICATIONS

Japan Patent Office, "Office Action for Japanese Patent Application No. 2019-529653," dated Jul. 23, 2019.

* cited by examiner

ELECTROSTATIC WORKPIECE-HOLDING METHOD AND ELECTROSTATIC WORKPIECE-HOLDING SYSTEM

RELATED APPLICATIONS

The present application is National Phase of International Application No. PCT/JP2018/027849 filed Jul. 25, 2018, and claims priorities from Japanese Application No. 2017-163798, filed Aug. 28, 2017 and Japanese Application No. 2017-239200, filed Dec. 14, 2017, the disclosure of which is hereby incorporated by reference herein in its entirety.

TECHNICAL FIELD

The present invention relates to an electrostatic workpiece-holding method and an electrostatic workpiece-holding system for holding a workpiece such as a conductor, a semiconductor, and a dielectric.

BACKGROUND ART

As an electrostatic workpiece-holding technique for holding a workpiece such as a silicon wafer, devices described in Patent Literature 1 and Patent Literature 2 are known, for example.

These devices include an electrostatic attracting part and a voltage controlling part. Specifically, the electrostatic attracting part is formed of a plurality of electrodes giving a pair of positive and negative charges and an insulating layer covering these electrodes. The voltage controlling part can apply a high voltage to the plurality of electrodes of the electrostatic attracting part and discharge the applied voltage.

Thus, an electrostatic attraction force is generated between a workpiece placed on a surface of the electrostatic attracting part and the electrostatic attracting part by applying a high voltage to the electrodes of the electrostatic attracting part by means of the voltage controlling part, and the workpiece is held on the electrostatic attracting part. The application of the high voltage to the electrodes is stopped by the voltage controlling part to eliminate the electrostatic attraction force between the workpiece and the electrostatic attracting part, whereby a release of the workpiece can be performed. That is, these devices function as an electrostatic chuck capable of sucking and holding (chucking) the workpiece by the electrostatic attraction force and also detaching (dechucking) the workpiece at the time of releasing.

CITATION LIST

Patent Literature

PLT1: Japanese Application Laid-Open No. H09-036212
PLT2: Japanese Application Laid-Open No. 2003-282671

SUMMARY OF THE INVENTION

Technical Problem

However, the foregoing conventional technique has the following problems.

More specifically, in the foregoing devices, the high voltage needs to be kept applied to the workpiece in order to generate the electrostatic attraction force between the workpiece and the electrostatic attracting part at the time of holding the workpiece. That is, a cable from a power supply needs to be kept connected to the electrodes in order to keep applying the high voltage to the electrodes at the time of holding the workpiece and carrying the electrostatic attracting part from a certain process to the next process. Where the distance between the processes is long, the workpiece is carried while a long cable is dragged, which is very inconvenient and leads to a reduction in work efficiency.

Further, in a thin-film silicon wafer, cracks or microcracks may be generated on a surface of the silicon wafer when the silicon wafer is peeled off from the electrostatic attracting part and singly conveyed. Thus, the generation of cracks, etc., can be prevented if such a thin-film silicon wafer can be transported in a state of being attracted to the electrostatic attracting part. However, such conveyance has been impossible in the conventional technique requiring the cable connection.

The present invention has been made in order to solve the foregoing problems, and an object thereof is to provide an electrostatic workpiece-holding method and an electrostatic workpiece-holding system capable of holding the workpiece with the voltage application to the electrodes of the electrostatic attracting part interrupted.

Solution to the Problems

In order to solve the foregoing problems, the first aspect of the present invention is an electrostatic workpiece-holding method for holding a workpiece, by an electrostatic attraction force, on a surface of an electrostatic attracting part formed of one or more first electrodes capable of applying a positive voltage, one or more second electrodes capable of applying a negative voltage, and a dielectric covering these first and second electrodes, comprising an initialization step of applying a positive voltage to the first electrode(s) and applying a negative voltage to the second electrode(s), a static elimination step of eliminating charges on the surface of the electrostatic attracting part after the execution of the initialization step, a workpiece setting step of abutting a workpiece against the surface of the electrostatic attracting part after the execution of the static elimination step, a workpiece attracting step of interrupting the application of the positive voltage to the first electrode(s) and the application of the negative voltage to the second electrode(s) after the execution of the workpiece setting step, and a workpiece release step of applying a positive voltage to the first electrode(s) and applying a negative voltage to the second electrode(s) after the execution of the workpiece attracting step.

With this configuration, upon execution of the initialization step, a positive voltage is applied to the first electrode(s) and a negative voltage is applied to the second electrode(s). Whereby, a positive charge corresponding to the positive voltage is charged on the surface of the electrostatic attracting part and at a position immediately above the first electrode(s), and a negative charge corresponding to the negative voltage is charged on the surface of the electrostatic attracting part and at a position immediately above the second electrode(s).

Then, upon execution of the static elimination step, the positive charge and the negative charge charged on the surface of the electrostatic attracting part are eliminated with the positive voltage applied to the first electrode(s) and the negative voltage applied to the second electrode(s), and the surface potential of the electrostatic attracting part becomes zero.

By executing the workpiece setting step in such a state, the workpiece is placed, etc., on the electrostatic attracting part so that the workpiece can be abutted against the surface of the electrostatic attracting part.

The workpiece attracting step is executed after the execution of the workpiece setting step, whereby the application of the positive voltage to the first electrode(s) and the application of the negative voltage to the second electrode(s) are interrupted, and a negative charge corresponding to the positive voltage is charged on the surface of the electrostatic attracting part and at a position immediately above the first electrode(s) and a positive charge corresponding to the negative voltage is charged on the surface of the electrostatic attracting part and at a position immediately above the second electrode(s).

As a result, a positive charge is induced on a back surface of the workpiece and at a position corresponding to the first electrode(s), and a negative charge is induced on the back surface of the workpiece and at a position corresponding to the second electrode(s). Whereby, the workpiece is attracted to the surface of the electrostatic attracting part by an electrostatic attraction force by the charges on the back surface of the workpiece and the charges on the surface of the electrostatic attracting part.

By executing the workpiece release step after the execution of the workpiece attracting step, a positive voltage is applied to the first electrode(s) and a negative voltage is applied to the second electrode(s). Whereby, the negative charge charged on the surface of the electrostatic attracting part and at the position immediately above the first electrode(s) and the positive charge charged at the position immediately above the second electrode(s) are cancelled out by the positive voltage and the negative voltage applied to the first and second electrodes. As a result, the electrostatic attraction force between the workpiece and the electrostatic attracting part is released, and the workpiece can be easily peeled off from the surface of the electrostatic attracting part.

The second aspect of the present invention is the electrostatic workpiece-holding method according to the first aspect of the present invention, wherein the static elimination step eliminates the charges on the surface of the electrostatic attracting part by applying a very weak X-ray to a gas around the electrostatic attracting part and ionizing the gas.

With this configuration, upon execution of the static elimination step, a very weak X-ray is applied to the gas around the electrostatic attracting part, and almost the same amount of positive ions and negative ions is produced around the electrostatic attracting part. The positive charge on the surface of the electrostatic attracting part and at the position immediately above the first electrode(s) is then neutralized by the negative ions, and the negative charge immediately above the second electrode(s) is neutralized by the positive ions. As a result, the entire surface of the electrostatic attracting part is charge-neutralized.

The third aspect of the present invention is the electrostatic workpiece-holding method according to the first or second aspect of the present invention, wherein the first and second electrodes of the electrostatic attracting part are either flat plate-shaped electrodes juxtaposed so as to adjoin each other at a predetermined interval or comb-shaped electrodes arranged so as to mesh with each other at a predetermined interval.

With this configuration, the workpiece can be electrostatically attracted by a Coulomb force where the first and second electrodes of the electrostatic attracting part are flat plate-shaped electrodes. Therefore, although a sufficient electrostatic attraction force cannot be obtained for an insulator workpiece on the electrostatic attracting part, a strong electrostatic attraction force by electrostatic induction can be obtained for a conductor workpiece or a semiconductor workpiece such as a silicon wafer, and the workpiece can be held firmly.

Where the first and second electrodes of the electrostatic attracting part are comb-shaped electrodes arranged so as to mesh with each other at a predetermined interval, the workpiece can be electrostatically attracted by a gradient force. Therefore, not only can the conductor or semiconductor workpiece be electrostatically attracted but also a strong electrostatic attraction force due to dielectric polarization can be obtained even for an insulator workpiece such as a glass substrate, and such a workpiece can be held firmly.

The fourth aspect of the present invention is an electrostatic workpiece-holding system including an electrostatic attracting part formed of one or more first electrodes capable of applying a positive voltage, one or more second electrodes capable of applying a negative voltage, and a dielectric covering these first and second electrodes, a power supply part capable of applying a positive voltage to the first electrode(s) and applying a negative voltage to the second voltage(s), a static eliminating part eliminating charges on a surface of the electrostatic attracting part, a workpiece setting part capable of abutting a workpiece against the surface of the electrostatic attracting part and taking out the workpiece from the surface of the electrostatic attracting part, and a control part controlling the workpiece setting part, the static eliminating part, and the power supply part, wherein the control part includes an initializing part turning on the power supply part, a static elimination driving part driving the static eliminating part after the actuation of the initializing part, a workpiece abutting part driving the workpiece setting part to abut the workpiece against the surface of the electrostatic attracting part after the actuation of the static elimination driving part, a workpiece attracting part turning off the power supply part after the actuation of the workpiece abutting part, and a workpiece releasing part turning on the power supply part and driving the workpiece setting part to take out the workpiece from the electrostatic attracting part after the actuation of the workpiece attracting part.

With this configuration, when the power supply part is turned on by the control of the initializing part of the control part, a positive voltage is applied to the first electrode(s) of the electrostatic attracting part and a negative voltage is applied to the second electrode(s). Whereby, a positive charge corresponding to the positive voltage is charged on the surface of the electrostatic attracting part and at a position immediately above the first electrode(s), and a negative charge corresponding to the negative voltage is charged on the surface of the electrostatic attracting part and at a position immediately above the second electrode(s).

Then, when the static eliminating part is driven by the control of the static elimination driving part, the charges on the surface of the electrostatic attracting part are eliminated by the static eliminating part. Whereby, the positive charge and the negative charge charged on the surface of the electrostatic attracting part are eliminated with the positive voltage applied to the first electrode(s) and the negative voltage applied to the second electrode(s), and the surface potential of the electrostatic attracting part becomes zero.

When the workpiece setting part is driven by the control of the workpiece abutting part in such a state, the workpiece is placed, etc., on the electrostatic attracting part by the workpiece setting part, and the workpiece is abutted against the surface of the electrostatic attracting part.

Then, when the power supply part is turned off by the control of the workpiece attracting part, the application of the positive voltage to the first electrode(s) and the application of the negative voltage to the second electrode(s) are interrupted. Whereby, a negative charge corresponding to the positive voltage is charged on the surface of the electrostatic attracting part and at a position immediately above the first electrode(s) and a positive charge corresponding to the negative voltage is charged on the surface of the electrostatic attracting part and at a position immediately above the second electrode(s).

As a result, a positive charge is induced on a back surface of the workpiece and at a position corresponding to the first electrode(s), and a negative charge is induced on the back surface of the workpiece and at a position corresponding to the second electrode(s). The workpiece is attracted to the surface of the electrostatic attracting part by an electrostatic attraction force by the charges on the back surface of the workpiece and the charges on the surface of the electrostatic attracting part.

When the control by the workpiece attracting part of the control part is completed, the power supply part is turned on by the control of the workpiece releasing part, and a positive voltage is applied to the first electrode(s) and a negative voltage is applied to the second electrode(s). Whereby, the negative charge charged on the surface of the electrostatic attracting part and at the position immediately above the first electrode(s) and the positive charge charged at the position immediately above the second electrode(s) are cancelled out by the positive voltage and the negative voltage applied to the first and second electrodes. As a result, the electrostatic attraction force between the workpiece and the electrostatic attracting part is released.

The workpiece setting part is driven by the control of the workpiece releasing part in such a state, and the workpiece is peeled off from the electrostatic attracting part.

The fifth aspect of the present invention is the electrostatic workpiece-holding system according to the fourth aspect of the present invention, wherein the static eliminating part is a static eliminator for eliminating the charges on the surface of the electrostatic attracting part by applying a very weak X-ray to a gas around the electrostatic attracting part and ionizing the gas.

With this configuration, when the static eliminator which is the static eliminating part is driven by the control of the static elimination driving part, a very weak X-ray output from the static eliminator is applied to the gas around the electrostatic attracting part, and almost the same amount of positive ions and negative ions is produced around the electrostatic attracting part. The positive charge on the surface of the electrostatic attracting part and at the position immediately above the first electrode(s) is neutralized by the negative ions, and the negative charge immediately above the second electrode(s) is neutralized by the positive ions. As a result, the entire surface of the electrostatic attracting part is charge-neutralized.

The sixth aspect of the present invention is the electrostatic workpiece-holding system according to the fourth or fifth aspect of the present invention, wherein the first and second electrodes of the electrostatic attracting part are either flat plate-shaped electrodes juxtaposed so as to adjoin each other at a predetermined interval or comb-shaped electrodes arranged so as to mesh with each other at a predetermined interval.

Effects of the Invention

As described above in detail, according to the present invention, the workpiece can be held by the electrostatic attracting part without applying the voltage to the first and second electrodes of the electrostatic attracting part. Therefore, the electrostatic attracting part can be carried without connecting the cable from the power supply to the electrostatic attracting part. As a result, there are excellent effects that the efficiency of the carrying operation can be increased and the electric power consumption can be reduced.

Even in the case of a workpiece such as a thin-film silicon wafer in which cracks or microcracks are likely to occur, there is an effect that only the electrostatic attracting part holding the workpiece can be conveyed safely without connecting the power supply cable.

Further, according to the third or sixth aspect of the present invention, there is an effect that the conductor workpiece or the semiconductor workpiece such as the silicon wafer can be held firmly by the Coulomb force, or not only the conductor or semiconductor workpiece but also the insulator workpiece can be held by the gradient force.

Further, according to the second and fifth aspects of the present invention, the surface of the electrostatic attracting part is configured to be charge-neutralized by applying a very weak X-ray to the gas around the electrostatic attracting part. Therefore, the surface can be charge-neutralized without bringing a static eliminating member, etc., into contact with the electrostatic attracting part. As a result, there is no occurrence such as wear or contamination of the surface of the electrostatic attracting part and generation of particles caused by a contact type static eliminating means. Thus, using these aspects of the present invention is particularly effective when charge-neutralizing a semiconductor substrate in which contamination by particles poses a problem.

Further, the amount of static elimination per unit time is larger than that of an ionizer which is the same non-contact type static eliminating means. Thus, the static elimination operating time can be shortened.

Furthermore, a wide-angle application of a very weak X-ray is possible. Accordingly, the static elimination processing becomes possible with respect to a large number of electrostatic attracting parts. As a result, the static elimination processing on a batch basis becomes possible, and the work efficiency can be improved.

DESCRIPTION OF THE EMBODIMENTS

Hereinafter, the best modes of the present invention will be described with reference to the drawings.

First Embodiment

Figure 1:
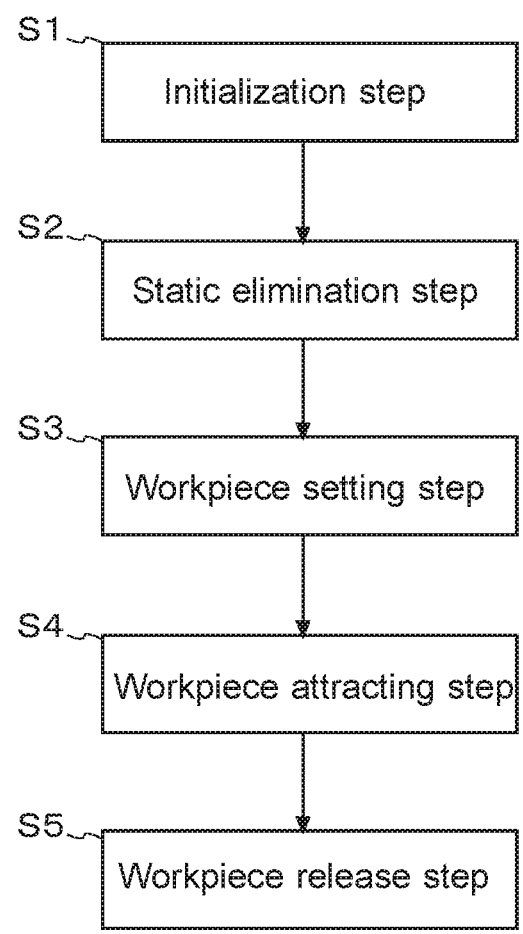
FIG. 1 is a flow diagram showing an electrostatic workpiece-holding method according to the first embodiment of the present invention.
Figure 2:
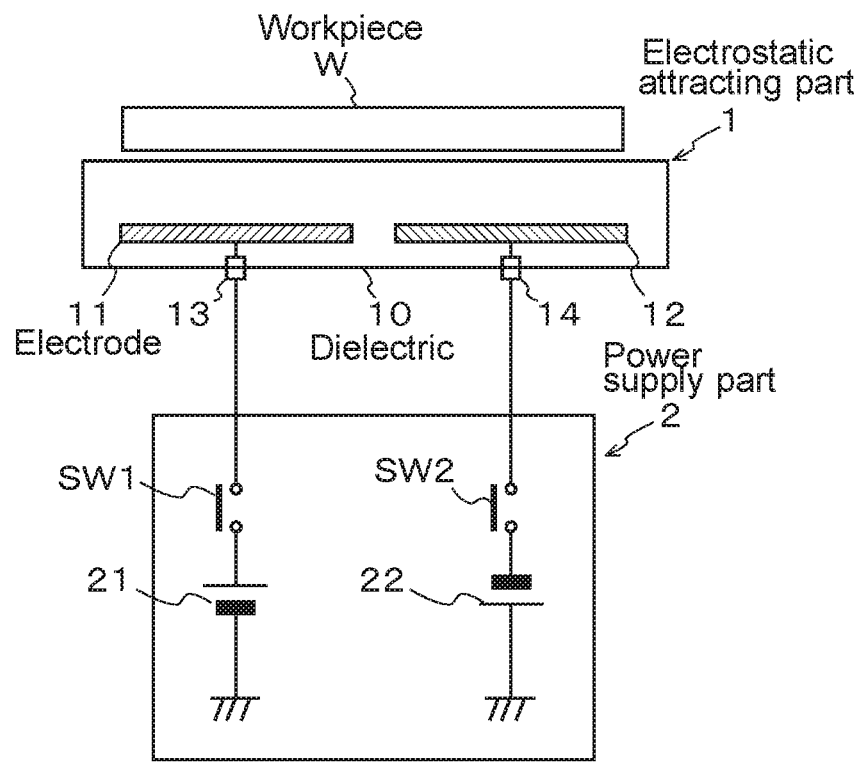
FIG. 2 is a schematic diagram showing a device for implementing the electrostatic workpiece-holding method of this embodiment.

FIG. 1 is a flow diagram showing an electrostatic workpiece-holding method according to the first embodiment of the present invention. FIG. 2 is a schematic diagram showing a device for implementing the electrostatic workpiece-holding method of this embodiment.

The electrostatic workpiece-holding method of this embodiment is a method for holding or releasing a workpiece on or from an electrostatic attracting part. This method includes an initialization step S1, a static elimination step S2, a workpiece setting step S3, a workpiece attracting step S4, and a workpiece release step S5, as shown in FIG. 1.

A device for performing these steps is constituted of an electrostatic attracting part 1 for electrostatically attracting a workpiece W and a power supply part 2 for supplying a predetermined high voltage to this electrostatic attracting part 1, as shown in FIG. 2.

The electrostatic attracting part 1 has such a structure that an electrode 11 as a first electrode and an electrode 12 as a second electrode are covered with a dielectric 10.

Figure 3:
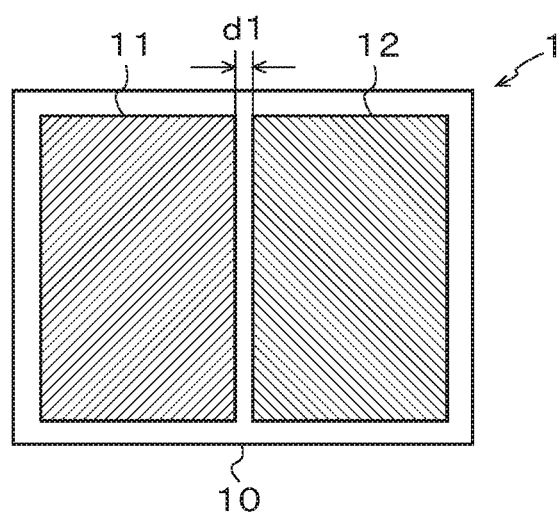
FIG. 3 is a plan view of an electrostatic attracting part shown with a pair of electrodes exposed.

FIG. 3 is a plan view of the electrostatic attracting part 1 shown with a pair of the electrodes 11, 12 exposed.

As shown in FIG. 3, the electrodes 11, 12 are two flat plate-shaped electrodes and arranged so as to adjoin each other at an interval d1.

As a material for such electrodes 11, 12, carbon ink was applied. As a material for the dielectric 10 covering the electrodes 11, 12, polyimide resin was applied.

As shown in FIG. 2, the power supply part 2 includes a power supply 21 capable of applying a positive voltage of, for example, +2000 V (bolt) to the electrode 11 and a power supply 22 capable of applying a negative voltage of, for example, −2000 V to the electrode 12. Specifically, the power supply 21 whose negative pole is grounded is electrically connected to the electrode 11 through a switch SW1 and a connector 13, and the power supply 22 whose positive pole is grounded is electrically connected to the electrode 12 through a switch SW2 and a connector 14.

Figure 4:
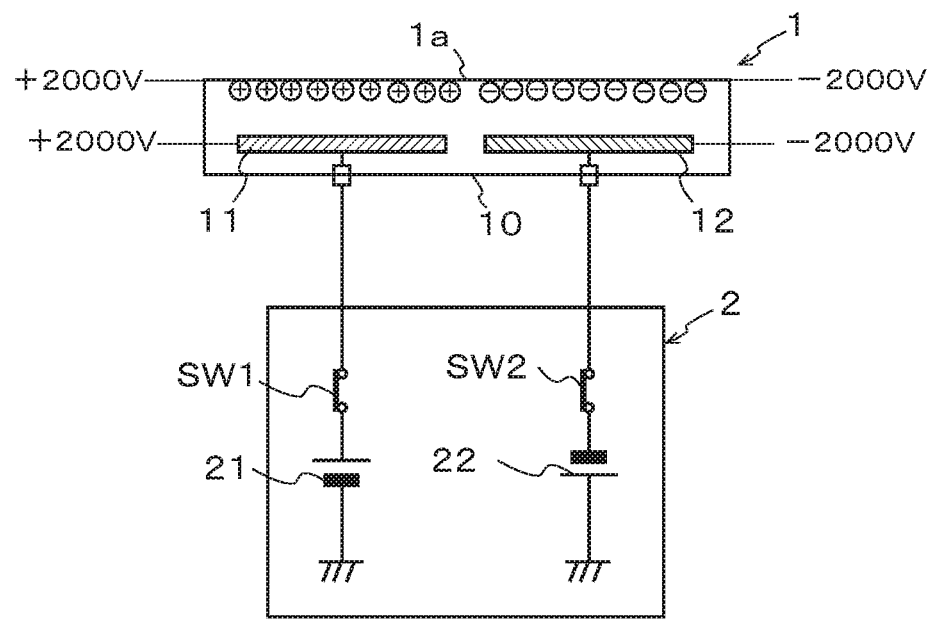
FIG. 4 is a schematic view showing the device in a state in which an initialization step has been executed.

FIG. 4 is a schematic diagram showing the device in a state in which the initialization step S1 has been executed.

The initialization step S1 is a step of applying a positive voltage to the electrode 11 of the electrostatic attracting part 1 and applying a negative voltage to the electrode 12.

Specifically, the switches SW1, SW2 of the power supply part 2 are both turned on, as shown in FIG. 4.

Whereby, the positive voltage of +2000 V is applied to the electrode 11 and the negative voltage of −2000 V is applied to the electrode 12. As a result, a positive charge corresponding to +2000 V is charged on a surface 1a of the electrostatic attracting part immediately above the electrode 11 and a region of the surface 1a concerned comes to have a potential of almost +2000 V. A negative charge corresponding to −2000 V is charged on the surface 1a of the electrostatic attracting part immediately above the electrode 12 and a region of the surface 1a concerned comes to have a potential of almost −2000 V.

Figure 5:
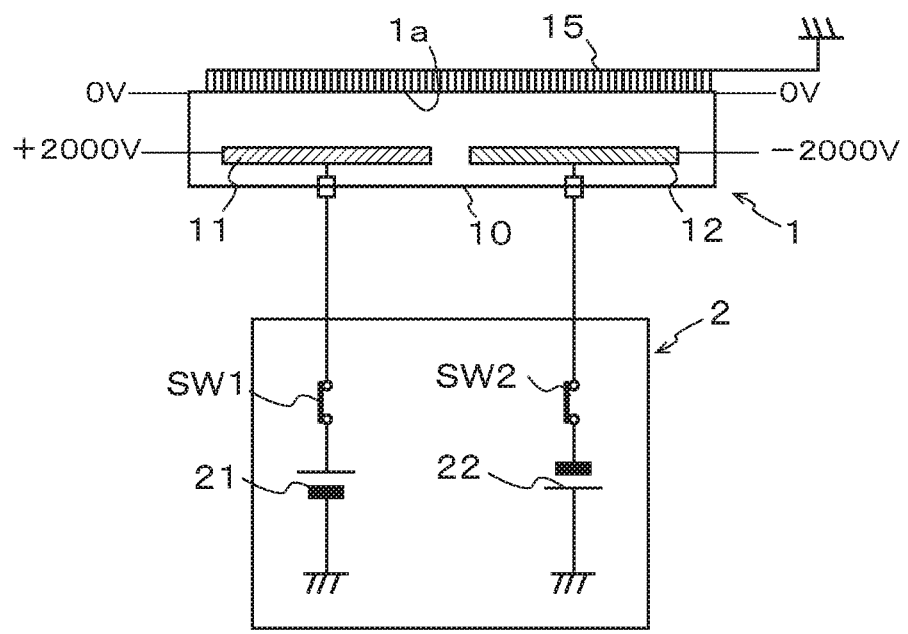
FIG. 5 is a schematic view showing the device in a state in which a static elimination step has been executed.

FIG. 5 is a schematic view showing the device in a state in which the static elimination step S2 has been executed.

The static elimination step S2 is a step of eliminating the charges on the surface 1a of the electrostatic attracting part 1, and this step is executed after the execution of the above initialization step S1.

Specifically, as shown in FIG. 5, an anti-static brush 15 grounded is brought into contact with almost the entire surface 1a of the electrostatic attracting part 1 with the switches SW1, SW2 of the power supply part 2 turned on. Thereafter, this anti-static brush 15 is moved away from the electrostatic attracting part 1 to cut off the contact with the electrostatic attracting part 1.

Whereby, the positive charge and the negative charge charged on the surface 1a of the electrostatic attracting part 1 are eliminated, and the potential of the surface 1a of the electrostatic attracting part 1 becomes almost 0 V.

Figure 6:
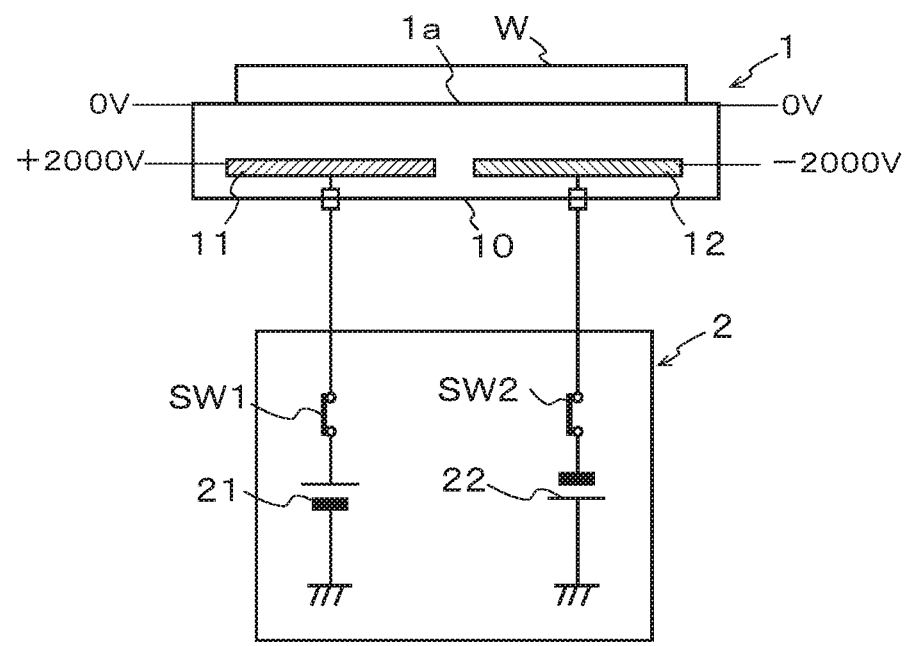
FIG. 6 is a schematic view showing the device in a state in which a workpiece setting step has been executed.

FIG. 6 is a schematic view showing the device in a state in which the workpiece setting step S3 has been executed.

The workpiece setting step S3 is a step of abutting the workpiece W against the surface 1a of the electrostatic attracting part 1, and this step is executed after the execution of the above static elimination step S2.

Specifically, as shown in FIG. 6, the workpiece W is placed on the electrostatic attracting part 1 with the switches SW1, SW2 of the power supply part 2 turned on, and the workpiece W is abutted against the surface 1a. At this moment, the surface 1a of the electrostatic attracting part 1 has been charge-neutralized by the above static elimination step S2, although the electrodes 11, 12 are maintained at +2000 V and −2000 V. Accordingly, an electrostatic attraction force by the charges is not generated between the workpiece W and the electrostatic attracting part 1. As a result, the workpiece W can be smoothly placed at any place on the surface 1a of the electrostatic attracting part 1.

Figure 7:
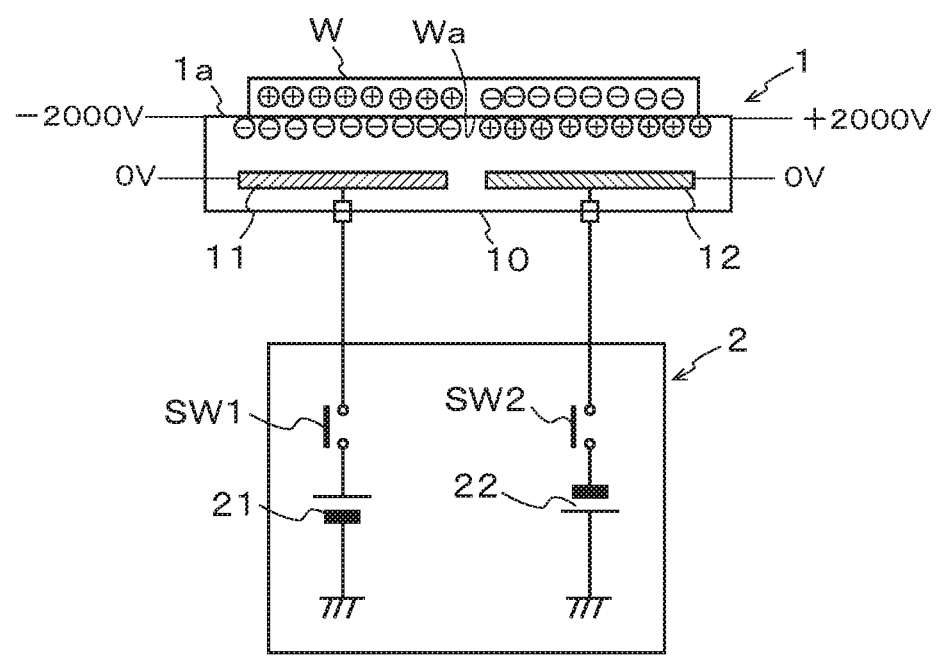
FIG. 7 is a schematic view showing the device in a state in which a workpiece attracting step has been executed.
Figure 8:
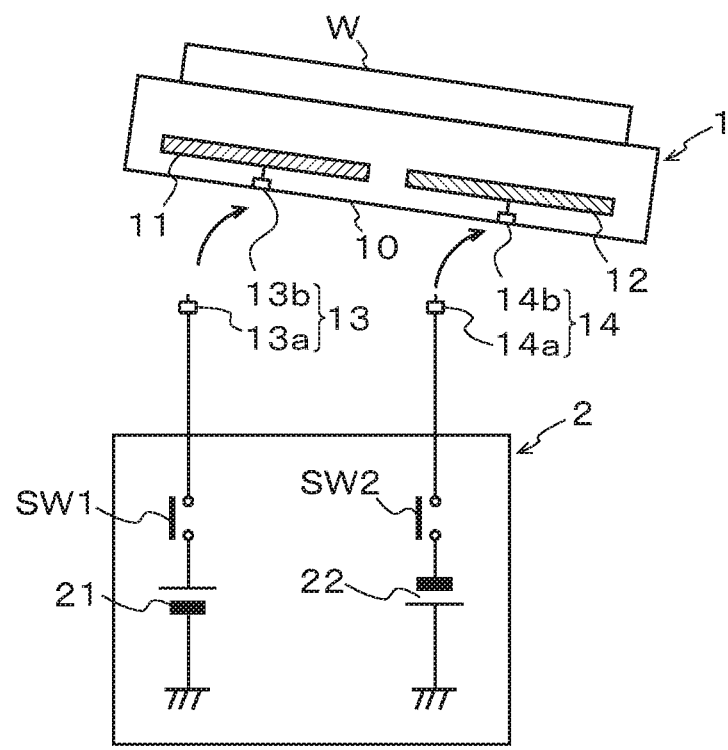
FIG. 8 is a schematic view showing a state in which the electrostatic attracting part is removed from a power supply part.

FIG. 7 is a schematic view showing the device in a state in which the workpiece attracting step S4 has been executed. FIG. 8 is a schematic view showing a state in which the electrostatic part 1 is removed from the power supply part 2.

The workpiece attracting step S4 is a step of interrupting the application of the positive voltage to the electrode 11 of the electrostatic attracting part 1 and the application of the negative voltage to the electrode 12, and this step is executed after the execution of the workpiece setting step S3.

Specifically, as shown in FIG. 7, the switches SW1, SW2 of the power supply part 2 are both turned off with the workpiece W placed on the electrostatic attracting part 1.

Whereby, the application of the positive voltage to the electrode 11 and the application of the negative voltage to the electrode 12 are interrupted, and the potentials of the electrodes 11, 12 are both changed to 0 V. Simultaneously, the surface 1a of the electrostatic attracting part immediately above the electrode 11 comes to have a potential of −2000 V, and the surface 1a of the electrostatic attracting part immediately above the electrode 12 comes to have a potential of +2000 V. That is, a negative charge corresponding to −2000 V is charged on the surface 1a of the electrostatic attracting part immediately above the electrode 11 and a positive charge corresponding to +2000 V is charged on the surface 1a of the electrostatic attracting part immediately above the electrode 12.

As a result, a positive charge is charged on a back surface Wa location of the workpiece W immediately above the electrode 11 and a negative charge is charged on the back surface Wa location of the workpiece W immediately above the electrode 12, so that an electrostatic attraction force by these charges is generated. By this electrostatic attraction force, the workpiece W is attracted to the surface 1a of the electrostatic attracting part 1.

Meanwhile, the electrodes 11, 12 are flat plate-shaped electrodes arranged side by side as shown in FIG. 3, so that the workpiece W is electrostatically attracted by the Coulomb force.

That is, where the workpiece W is a conductor or a semiconductor such as a silicon wafer, the workpiece W is brought into an electrostatic induction state in which an internal electric field is zero, by an external electric field between the positive and negative charges on the surface 1a of the electrostatic attracting part. Therefore, the workpiece W is attracted to the surface 1a of the electrostatic attracting part by a strong electrostatic attraction force. Moreover, since the unit area of the electrodes 11, 12 per unit area of the workpiece is large, a large attraction force can be obtained in this regard as well.

In this manner, the workpiece W can be held by the electrostatic attracting part 1 with the power supply part 2 being turned off by executing the workpiece attracting step S4. Thus, as shown in FIG. 8, the workpiece W is kept attracted to the electrostatic attracting part 1 even if a male connector 13a and a female connector 13b of the connector 13 are detached and a male connector 14a and a female connector 14b of the connector 14 are detached. Accordingly, only the electrostatic attracting part 1 attracting the workpiece W can be carried to a predetermined place without connecting the cable from the power supply part 2 to the electrostatic attracting part 1.

Figure 9:
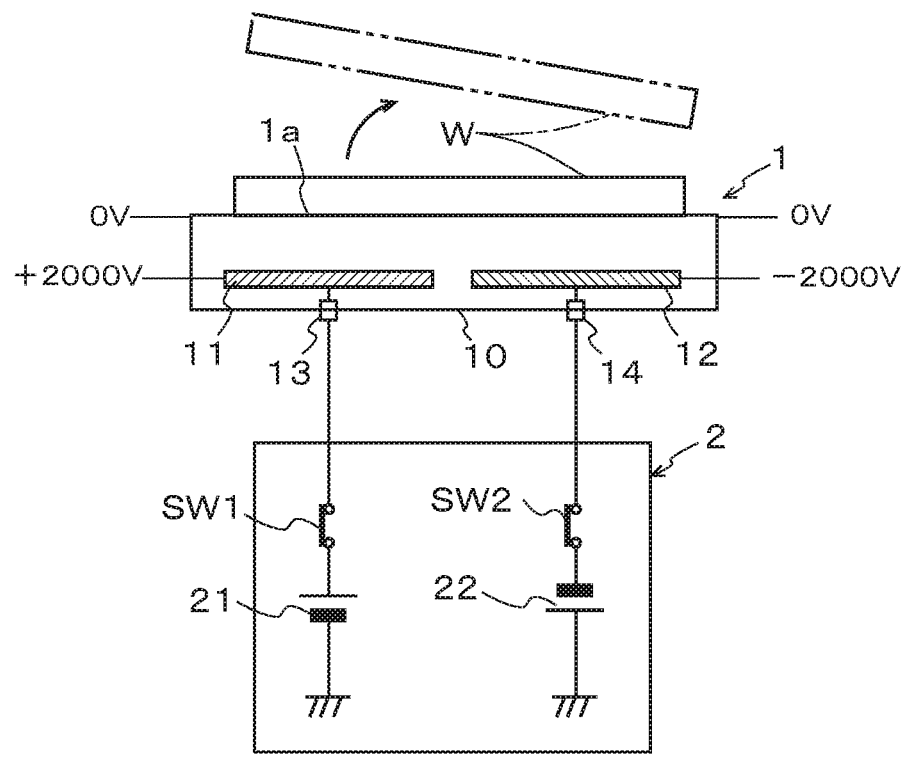
FIG. 9 is a schematic view showing the device in a state in which a workpiece release step has been executed.

FIG. 9 is a schematic view showing the device in a state in which the workpiece release step S5 has been executed.

The workpiece release step S5 is a step of applying a positive voltage to the electrode 11 of the electrostatic attracting part 1 and applying a negative voltage to the electrode 12, and this step is executed after the execution of the workpiece attracting step S4.

Specifically, a predetermined processing is carried out on the workpiece W in the state shown in FIG. 7 or the electrostatic attracting part 1 shown in FIG. 8 is connected to the power supply part 2 of the conveyance destination via the connectors 13, 14, thereafter the switches SW1, SW2 of the power supply part 2 are both turned on.

Whereby, a positive voltage of +2000 V is applied to the electrode 11 and a negative voltage of −2000 V is applied to the electrode 12. As a result, the negative charge (see FIG. 7) having been charged on the surface 1a of the electrostatic attracting part immediately above the electrode 11 is eliminated and a region of the surface 1a concerned comes to have a potential of almost 0 V. The positive charge (see FIG. 7) having been charged on the surface 1a of the electrostatic attracting part immediately above the electrode 12 is eliminated and a region of the surface 1a concerned also comes to have a potential of 0 V. As a result, the electrostatic attraction force between the workpiece W and the electrostatic attracting part 1 is released, and the workpiece W can be easily peeled off from the surface 1a of the electrostatic attracting part 1 as shown by a chain double-dashed line.

Second Embodiment

Next, the second embodiment of the present invention will be described.

Figure 10:
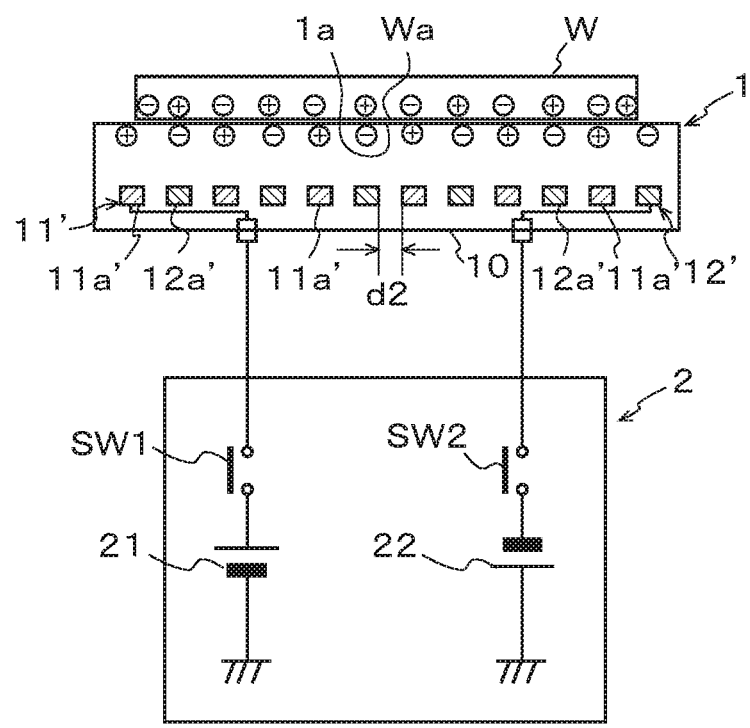
FIG. 10 is a schematic view of a device showing a main part of an electrostatic workpiece-holding method according to the second embodiment of the present invention.
Figure 11:
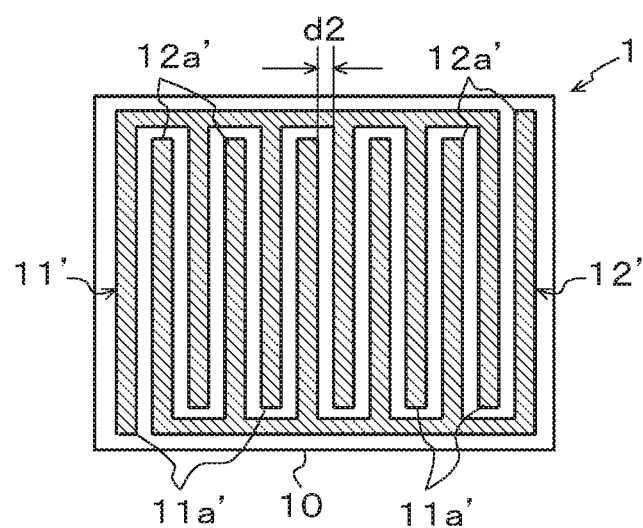
FIG. 11 is a plan view of an electrostatic attracting part shown with a pair of electrodes exposed.

FIG. 10 is a schematic view of a device showing a main part of an electrostatic workpiece-holding method according to the second embodiment of the present invention. FIG. 11 is a plan view of an electrostatic attracting part 1 shown with a pair of electrodes 11', 12' exposed.

The electrostatic workpiece-holding method of this embodiment differs from the foregoing first embodiment in that comb-shaped electrodes 11', 12' are used as the first and second electrodes.

Specifically, as shown in FIG. 10 and FIG. 11, the electrodes 11', 12' covered with a dielectric 10 of the electrostatic attracting part 1 are both formed in a comb shape and arranged so as to mesh with each other at an interval d2.

With this configuration, a workpiece W is electrostatically attracted by a gradient force.

That is, upon execution of a workpiece attracting step S4, a positive charge is charged on a surface 1a of the electrostatic attracting part immediately above each tooth part 11a' of the electrode 11' and a negative charge is charged on the surface 1a of the electrostatic attracting part immediately above each tooth part 12a' of the electrode 12', as shown in FIG. 10. As a result, charges having polarities opposite to those of these charges are alternately charged on a back surface Wa of the workpiece W. That is, the back surface Wa of the workpiece W is brought into a dielectric polarization state. Thus, when an insulator such as a glass substrate is used as the workpiece W, the inside of the workpiece W comes into the dielectric polarization state and the workpiece W is reliably attracted to the electrostatic attracting part 1. That is, since the flat plate-shaped electrodes 11, 12 are used in the electrostatic attracting part 1 of the foregoing first embodiment, the insulator such as the glass substrate in which the Coulomb force is not generated cannot be used as the workpiece W. However, the insulator is such that dielectric polarization is caused inside by an external electric field. Therefore, when this insulator workpiece W is placed on the electrostatic attracting part 1 in which the positive and negative charges are alternately arranged as in this embodiment, the workpiece W is attracted firmly to the electrostatic attracting part 1 by the gradient force. That is, the insulator workpiece W can be electrostatically attracted by using the electrostatic workpiece-holding method of this embodiment.

It is a matter of course that the workpiece W is attracted to the electrostatic attracting part 1 even when the workpiece W is a conductor or a semiconductor. However, the electrodes 11', 12' of this embodiment have a unit area of the electrode per unit area of the workpiece being almost half of that of the electrodes 11, 12 of the foregoing first embodiment. Therefore, it is understood that the attraction force is reduced to about half as compared with the electrodes 11, 12 of the first embodiment.

Other configurations, operations and effects are the same as those of the foregoing first embodiment, and thus their description is omitted.

Third Embodiment

Next, the third embodiment of the present invention will be described.

Figure 12:
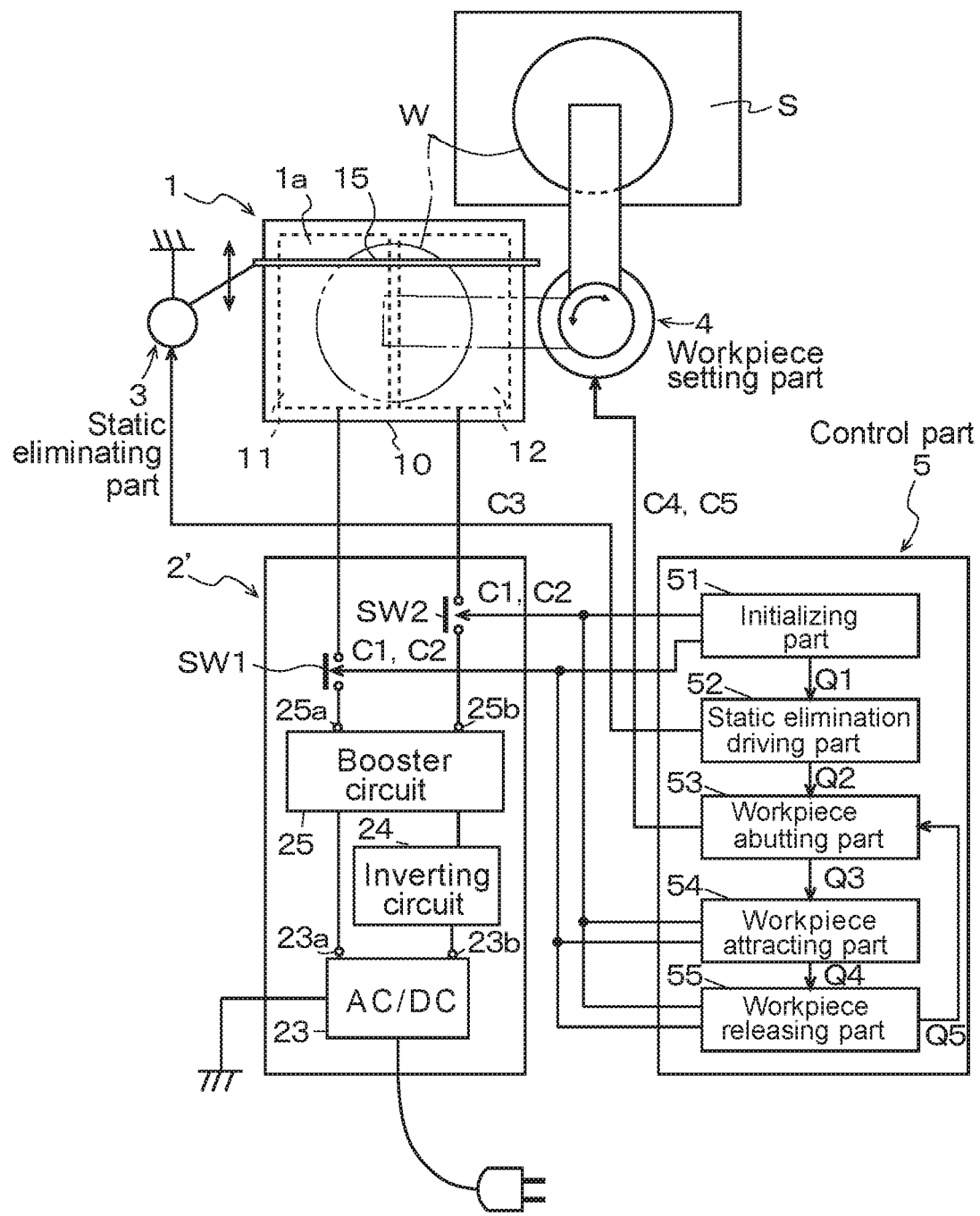
FIG. 12 is a block diagram showing an electrostatic workpiece-holding system according to the third embodiment of the present invention.

FIG. 12 is a block diagram showing an electrostatic workpiece-holding system according to the third embodiment of the present invention.

The electrostatic workpiece-holding system of this embodiment is a system capable of automatically implementing the electrostatic workpiece-holding method of the foregoing first embodiment.

This electrostatic workpiece-holding system includes the electrostatic attracting part 1 exemplified in the first embodiment, a power supply part 2', a static eliminating part 3, a workpiece setting part 4, and a control part 5, as shown in FIG. 12.

The power supply part 2' is a part capable of applying a positive voltage to an electrode 11 of the electrostatic attracting part 1 and applying a negative voltage to an electrode 12, and has the same function with the power supply part 2 of the foregoing first embodiment.

Specifically, the power supply part 2' includes an AC/DC converting circuit 23, an inverting circuit 24, a booster circuit 25, and switches SW1, SW2.

The AC/DC converting circuit 23 is a circuit that converts an input commercial alternating current power supply of +100 V to a direct current voltage of, for example, +24 V and outputs the direct current voltage from output terminals 23a, 23b, respectively.

The output terminal 23a of the AC/DC converting circuit 23 is directly connected to the booster circuit 25, and the output terminal 23b is connected to the booster circuit 25 through the inverting circuit 24. That is, the direct current voltage of +24 V having been output from the output terminal 23a of the AC/DC converting circuit 23 is directly input to the booster circuit 25 as is. On the other hand, the direct current voltage of +24 V having been output from the output terminal 23b is inverted to a direct current voltage of −24 V by the inverting circuit 24, and then is directly input to the booster circuit 25.

The booster circuit 25 is a circuit that amplifies the direct current voltage of +24 V from the AC/DC converting circuit 23 to, for example, +2000 V and outputs it from an output terminal 25a and also amplifies the direct current voltage of −24 V from the inverting circuit 24 to, for example, −2000 V and outputs it from an output terminal 25b.

The output terminal 25a of the booster circuit 25 is connected to the electrode 11 of the electrostatic attracting part 1 through the switch SW1, and the output terminal 25b is connected to the electrode 12 through the switch SW2.

That is, in the power supply part 2', the output terminal 23a of the AC/DC converting circuit 23 and the booster circuit 25 correspond to the power supply 21 of the power supply part 2 of the foregoing first embodiment, and the output terminal 23b of the AC/DC converting circuit 23, the inverting circuit 24, and the booster circuit 25 correspond to the power supply 22 of the power supply part 2 of the foregoing first embodiment.

The switches SW1, SW2 are the same switches as those of the foregoing first embodiment, and their on and off operations are controlled by the control part 5.

The static eliminating part 3 is a part that eliminates the charges charged on the electrostatic attracting part 1 by moving an anti-static brush 15 while contacting the anti-static blush 15 with the surface 1a of the electrostatic attracting part 1, and the moving operation of this static eliminating part 3 is controlled by the control part 5.

The workpiece setting part 4 is a part that places a workpiece W located at a predetermined place S onto the surface 1a of the electrostatic attracting part 1 or takes out the workpiece W placed on the electrostatic attracting part 1 and returns the workpiece W to the predetermined place S. This workpiece setting part 4 is controlled by the control part 5.

The control part 5 is a part that controls the power supply part 2', the static eliminating part 3, and the workpiece setting part 4. This control part 5 includes a computer and its program. Specifically, the control part 5 includes an initializing part 51, a static elimination driving part 52, a workpiece abutting part 53, a workpiece attracting part 54, and a workpiece releasing part 55 as functional blocks.

The initializing part 51 has a function of sending an ON control signal C1 to the power supply part 2' to turn on the switches SW1, SW2 and outputting a command signal Q1 to the static elimination driving part 52.

The static elimination driving part 52 has a function of outputting a control signal C3 to the static eliminating part 3 to drive the static eliminating part 3 upon input of the command signal Q1 from the initializing part 51 and outputting a command signal Q2 to the workpiece abutting part 53.

The workpiece abutting part 53 has a function of outputting a control signal C4 to the workpiece setting part 4 to control the placing operation of the workpiece setting part 4 upon input of the command signal Q2 from the static elimination driving part 52 and outputting a command signal Q3 to the workpiece attracting part 54. The workpiece abutting part 53 also has a function of outputting a control signal C5 to the workpiece setting part 4 to control the taking-out operation of the workpiece setting part 4 upon input of a command signal Q5 from the workpiece releasing part 55 described later.

The workpiece attracting part 54 has a function of sending an OFF control signal C2 to the power supply part 2' to turn off the switches SW1, SW2 upon input of the command signal Q3 from the workpiece abutting part 53 and outputting a command signal Q4 to the workpiece releasing part 55 after an elapse of a predetermined time.

The workpiece releasing part 55 has a function of sending an ON control signal C1 to the power supply part 2' to turn on the switches SW1, SW2 upon input of the command signal Q4 from the workpiece attracting part 54 and outputting a command signal Q5 to the workpiece abutting part 53.

Next, the operation shown by the electrostatic workpiece-holding system of this embodiment will be described.

Upon actuation of the control part 5, first, the initializing part 51 functions, and the power supply part 2' having received the ON control signal C1 from the initializing part 51 is turned on, and the electrostatic attracting part 1 is brought into a voltage state and an electrically charged state as shown in FIG. 4 (execution of the initialization step S1).

Thereafter, the static elimination driving part 52 having input the command signal Q1 from the initializing part 51 functions, and the static eliminating part 3 having input the control signal C3 from the static elimination driving part 52 charge-neutralizes the surface 1*a* of the electrostatic attracting part 1 by using the anti-static brush 15 of the electrostatic attracting part 1. As a result, the electrostatic attracting part 1 is brought into a voltage state and an electrically charged state as shown in FIG. 5 (execution of the static elimination step S2).

Then, the workpiece abutting part 53 having input the command signal Q2 from the static elimination driving part 52 functions, and the workpiece setting part 4 having input the control signal C4 from the workpiece abutting part 53 places the workpiece W on the electrostatic attracting part 1 (execution of the workpiece setting step S3).

In this state, the workpiece attracting part 54 inputs the command signal Q3 from the workpiece abutting part 53 and functions, and the power supply part 2' having received the OFF control signal C2 from the workpiece attracting part 54 is turned off. As a result, the electrostatic attracting part 1 and the workpiece W are brought into a voltage state and an electrically charged state shown in FIG. 7, and the workpiece W is attracted to the surface 1*a* of the electrostatic attracting part 1 (execution of the workpiece attracting step S4).

Thereafter, when a predetermined time elapses and the processing of the workpiece W is completed, the workpiece releasing part 55 having input the command signal Q4 from the workpiece attracting part 54 functions and the power supply part 2' is turned on. Then, the electrostatic attracting part 1 and the workpiece W are brought into a voltage state and an electrically charged state shown in FIG. 9. The workpiece abutting part 53 having input the command signal Q5 from the workpiece releasing part 55 then outputs the control signal C5 to the workpiece setting part 4 to control the taking-out operation of the workpiece setting part 4. Whereby, the workpiece W having been processed is returned onto the predetermined place S (execution of the workpiece release step S5).

By the above, one cycle of the operation by the electrostatic workpiece-holding system of this embodiment is completed.

Other configurations, operations and effects are the same as those of the foregoing first and second embodiments, and thus, their description is omitted.

Fourth Embodiment

Next, the fourth embodiment of the present invention will be described.

A static eliminating means for executing the static elimination step in the electrostatic workpiece-holding method of the present invention includes a contact type static eliminating means which brings a static eliminating member into contact with the electrostatic attracting part to eliminate charges on the surface of the electrostatic attracting part and a non-contact type static eliminating means which eliminates charges on the surface of the electrostatic attracting part without bringing the static eliminating member into contact with the electrostatic attracting part.

The contact type static eliminating means includes static eliminating equipment such as an anti-static cord, and one that a conductor such as a conductor metal plate or a conductor rubber sheet or a conductor material is made into an earth plate, other than the anti-static brush 15 applied in the foregoing embodiment. In addition, a method of applying a liquid such as isopropyl alcohol or ethyl alcohol to the electrostatic attracting part or bringing a gas such as argon gas into contact with the electrostatic attracting part can also be applied as the contact type static eliminating means.

The contact type static eliminating means can completely eliminate static electricity from the electrostatic attracting part in a low voltage state to the electrostatic attracting part in a high voltage state. Moreover, the contact type static eliminating means is an excellent static eliminating means since the static elimination time is short and the amount of static elimination per unit time is large. However, in this static eliminating means, the static eliminating member is brought into contact with the surface of the electrostatic attracting part, so that the electrostatic attracting part may be worn out or contaminated and in which particles may be generated around the electrostatic attracting part may occur. In the case of a semiconductor substrate such as a silicon wafer, it is not preferable that these do not occur at the time of static elimination. Therefore, the semiconductor substrate such as the silicon wafer cannot be used in the electrostatic workpiece-holding method including the contact type static elimination step.

On the other hand, the non-contact type static eliminating means includes an ionizer. A static elimination method by this ionizer is such that a high voltage is applied into the air to generate corona discharge and the electrostatic attracting part is charge-neutralized by using ions having been produced by this discharge. This static eliminating means is superior in not causing occurrences such as wear or contamination of the electrostatic attracting part and the generation of particles. However, this static eliminating means has disadvantages that the static elimination time is long and the amount of static elimination per unit time is small. Further, reverse charging is easily caused on the electrostatic attracting part, and static elimination control is difficult. Furthermore, since the static elimination range is narrow, a large number of electrostatic attracting parts cannot be subjected to the static elimination processing at one time. Thus, there is also a disadvantage that this static eliminating means is inferior in work efficiency as well.

Thus, in this embodiment, an electrostatic workpiece-holding method including a static elimination step in which the static elimination time is short, the amount of static elimination per unit time is large, the static elimination control is easy, and a large number of electrostatic attracting parts can be subjected to the static elimination processing at one time (batch processing), in spite of being non-contact will be exemplified.

Figure 13:
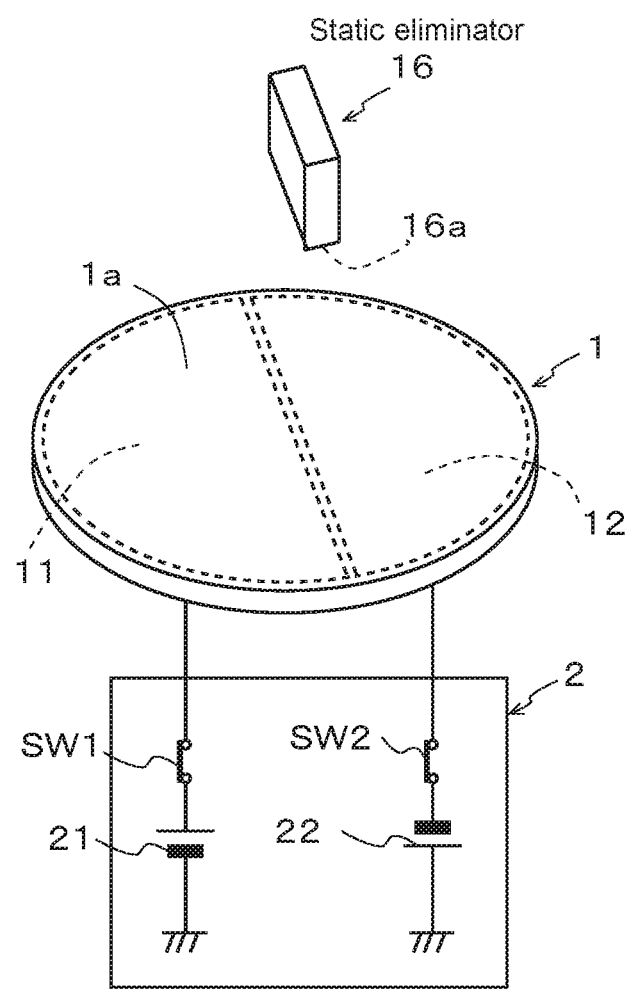
FIG. 13 is a perspective view showing an electrostatic workpiece-holding method according to the fourth embodiment of the present invention.
Figure 14:
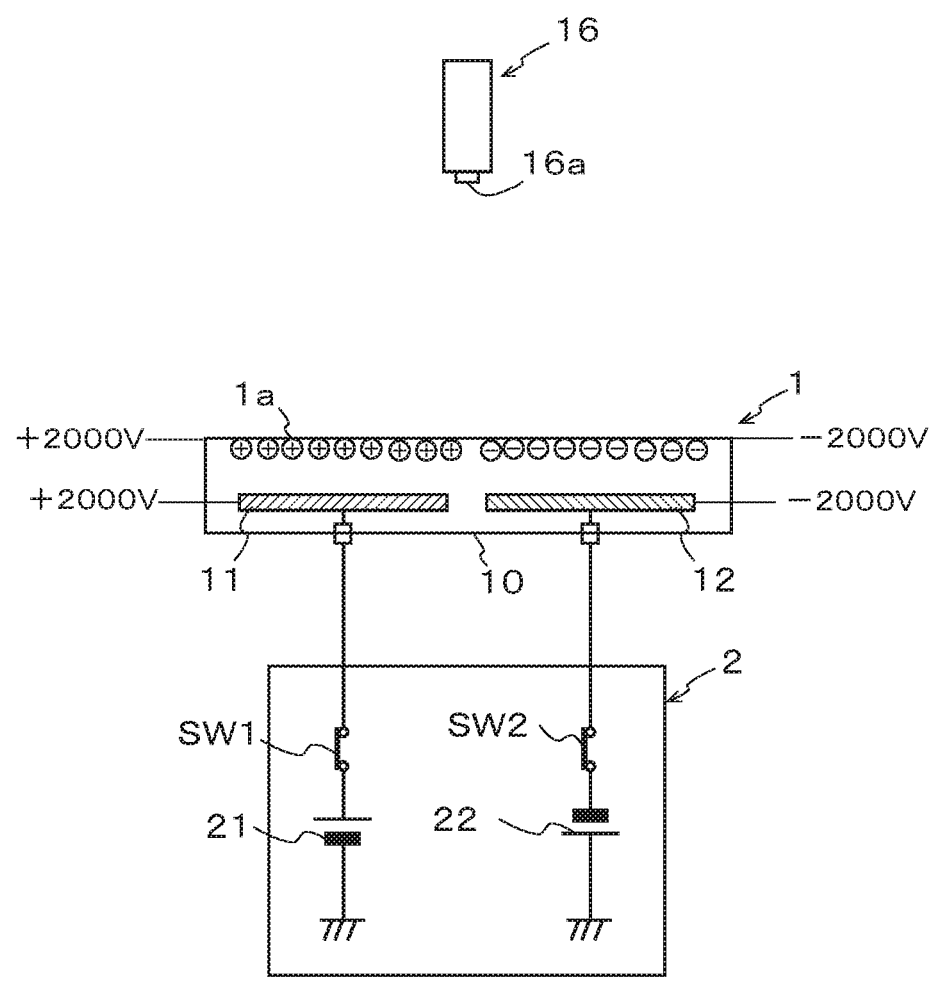
FIG. 14 is a schematic view showing an arrangement of a static eliminator at the time of an initialization step.

FIG. 13 is a perspective view showing the electrostatic workpiece-holding method according to the fourth embodiment of the present invention. FIG. 14 is a schematic view showing an arrangement of a static eliminator at the time of an initialization step.

A static elimination step S2 applied in this embodiment is a step of eliminating charges on a surface 1*a* of an electrostatic attracting part 1 using a static eliminator 16.

Specifically, the static eliminator 16 is a device capable of applying a very weak X-ray to a gas around the electrostatic attracting part 1 at the time of actuation and ionizing the gas. As the static eliminator 16, "Photo Ion Bar L12536", "Photo Ionizer L12645", and "Photo Ionizer L11754" of Hamamatsu Photonics K.K. can be applied for example.

Such a static eliminator 16 is arranged immediately above the electrostatic attracting part 1 and has an output window 16*a* facing the surface 1*a* of the electrostatic attracting part 1, as shown in FIG. 13 and FIG. 14.

Whereby, upon actuation of the static eliminator 16, a very weak X-ray is applied from the output window 16a of the static eliminator 16 toward the surface 1a of the electrostatic attracting part 1.

When an initialization step S1 is executed in the electrostatic workpiece-holding method of this embodiment, a positive voltage of +2000 V is applied to an electrode 11 and a negative voltage of −2000 V is applied to an electrode 12 in the same manner as the foregoing first embodiment. As a result, a positive charge corresponding to +2000 V is charged on the surface 1a of the electrostatic attracting part immediately above the electrode 11 and a negative charge corresponding to −2000 V is charged on the surface 1a of the electrostatic attracting part immediately above the electrode 12, as shown in FIG. 14.

Figure 15:
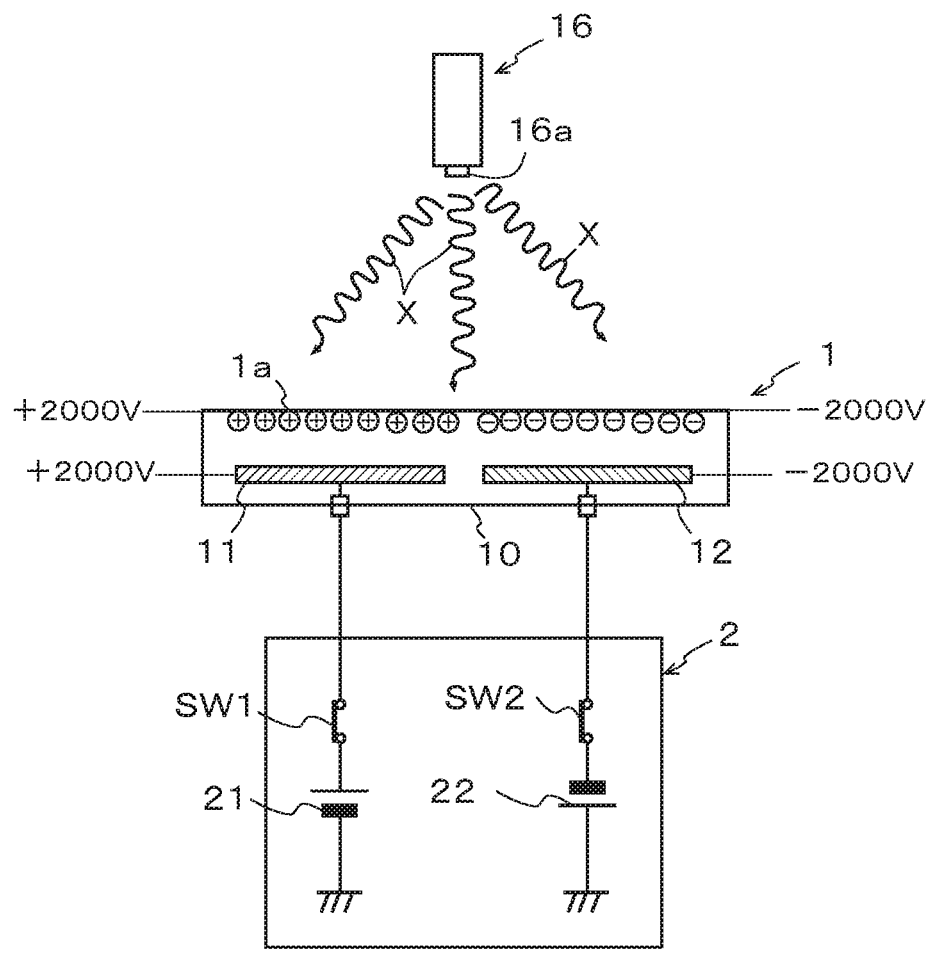
FIG. 15 is a schematic view showing a state in which a static elimination step has been executed.
Figure 16:
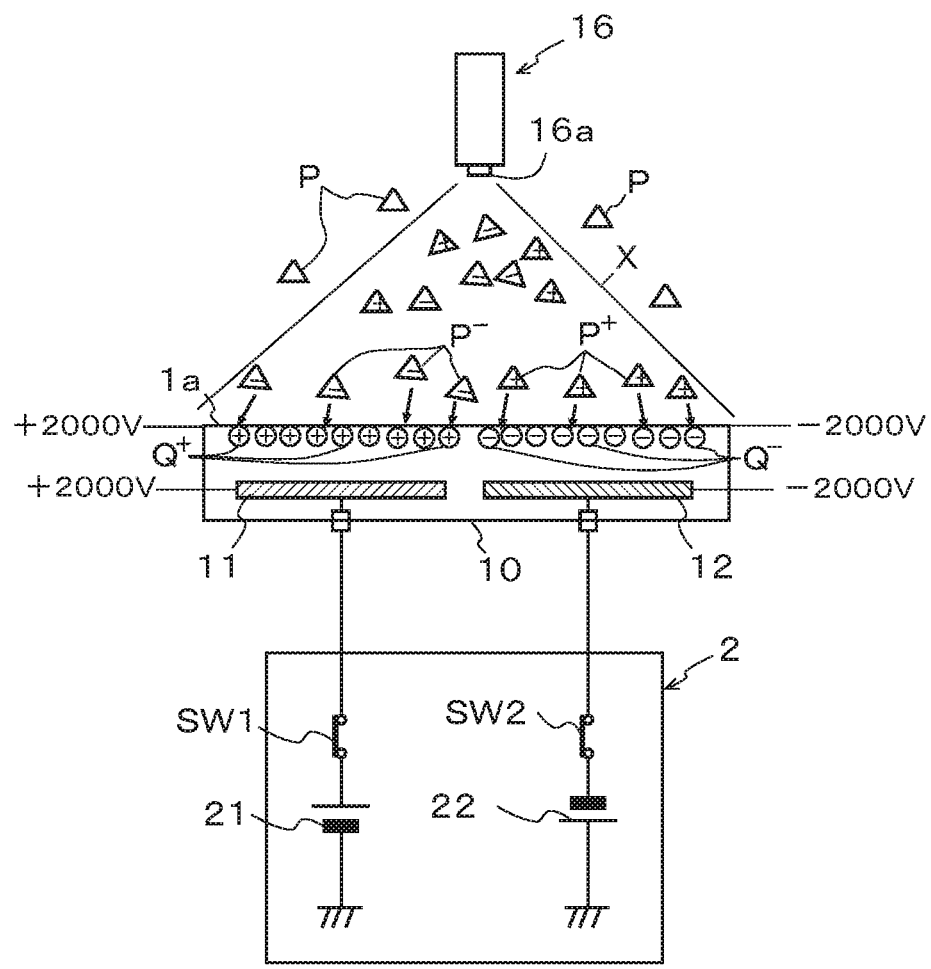
FIG. 16 is a schematic view for explaining a static elimination action in the static elimination step.
Figure 17:
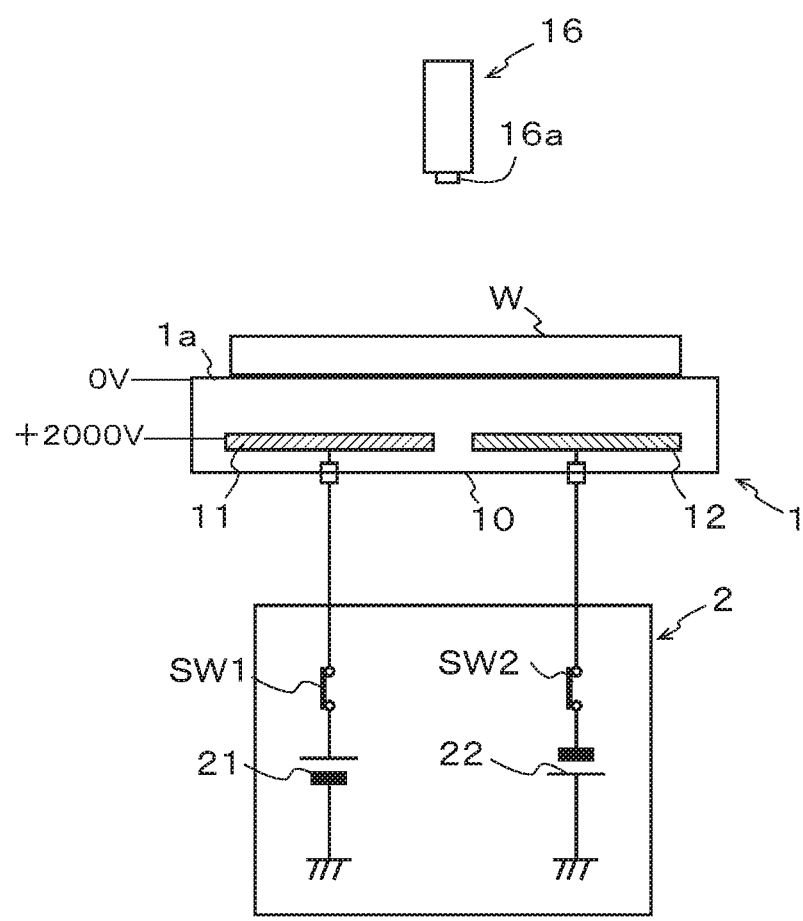
FIG. 17 is a schematic view showing a workpiece setting step.

FIG. 15 is a schematic view showing a state in which the static elimination step has been executed. FIG. 16 is a schematic view for explaining a static elimination action in the static elimination step. FIG. 17 is a schematic view showing a workpiece setting step.

After the execution of the initialization step S1, the static elimination step S2 is executed. That is, as shown in FIG. 15, the static eliminator 16 is actuated to apply a very weak X-ray toward the surface 1a of the electrostatic attracting part 1 from the output window 16a.

Neutral particles P such as oxygen molecules and nitrogen molecules are present around the electrostatic attracting part 1. Thus, when a very weak X-ray is applied therearound from the static eliminator 16, as shown in FIG. 16, the neutral particles P within the application area of a very weak X-ray are separated into positive ions $P^+$ and negative ions $P^-$ and the same number of positive ions $P^+$ and negative ions $P^-$ is produced within the application area of a very weak X-ray.

Then, a positive charge $Q^+$ charged immediately above the electrode 11 is electrically bonded with a nearby negative ion $P^-$ and disappears, and a negative charge $Q^-$ charged immediately above the electrode 12 is electrically bonded with a nearby positive ion $P^+$ and disappears.

As a result, as shown in FIG. 17, the positive charge Q+ and the negative charge Q− charged on the surface 1a of the electrostatic attracting part 1 are all eliminated and the potential of the surface 1a of the electrostatic attracting part 1 becomes almost 0 V.

After an elapse of a predetermined time, the static elimination step S2 is completed by stopping the operation of the static eliminator 16. The workpiece setting step S3 is executed, and the workpiece W can be placed on the surface 1a of the electrostatic attracting part 1 in the non-electrically charged state.

The inventor carried out the following measurements to confirm such effects.

Figure 18:
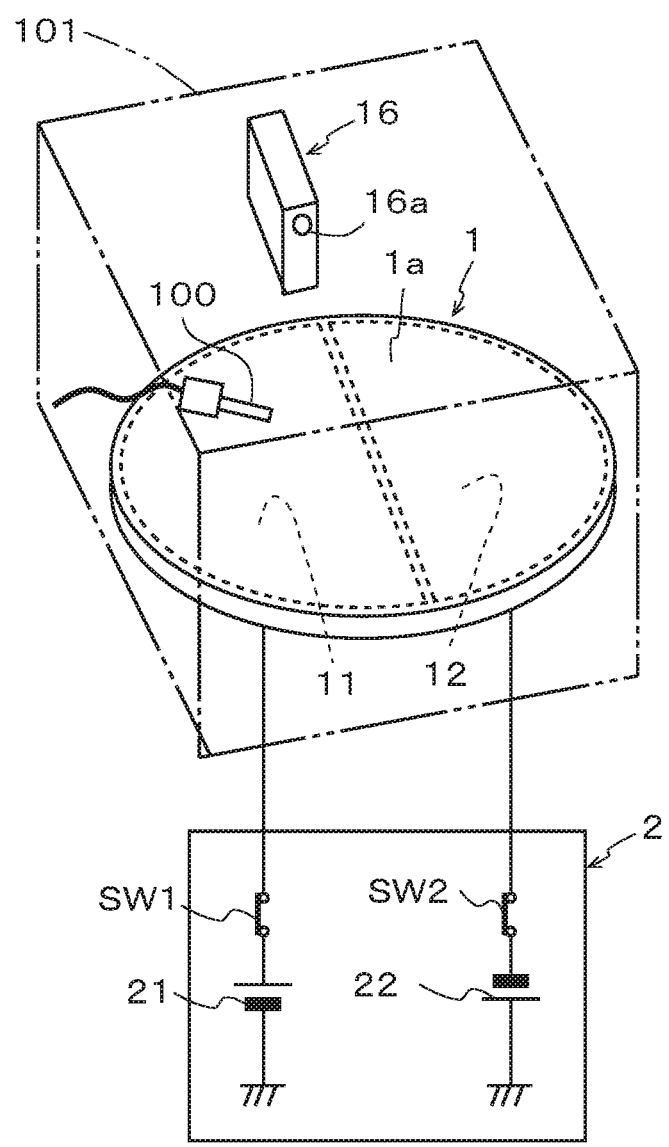
FIG. 18 is a schematic view showing an experimental device.
Figure 19:
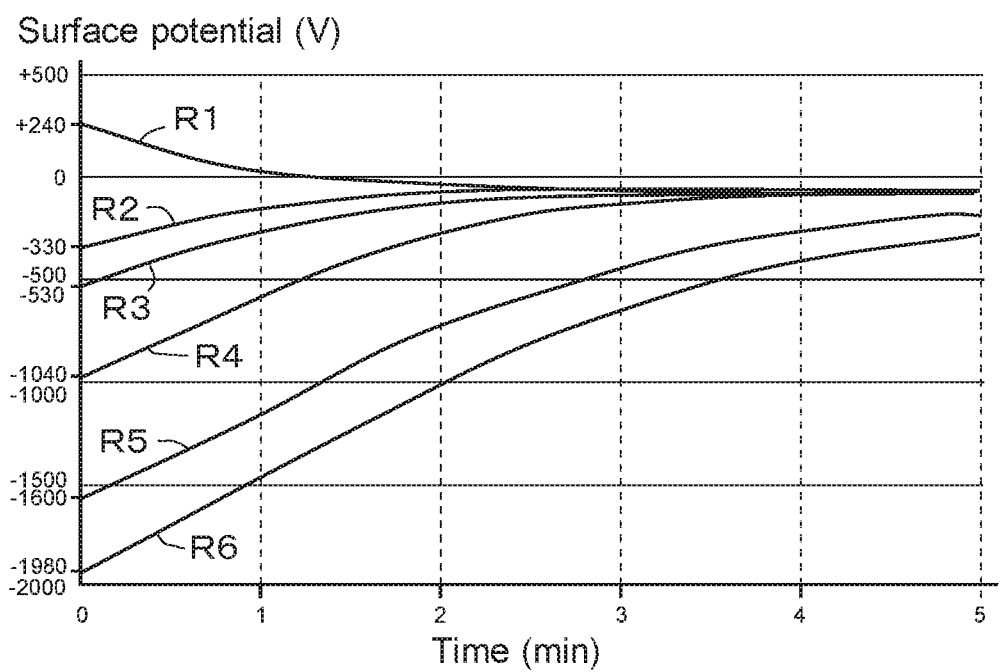
FIG. 19 is a diagram showing experimental results.

FIG. 18 is a schematic view showing an experimental device. FIG. 19 is a diagram showing experimental results.

As shown in FIG. 18, the experimental device included an electrostatic attracting part 1 to which a power supply part 2 is connected, a static eliminator 16, a surface potential meter 100, and an X-ray shielding box 101 in this experiment.

Specifically, the static eliminator 16 was arranged beside the electrostatic attracting part 1 and near the boundary between the electrodes 11, 12, and the surface potential meter 100 was arranged close to the surface 1a of the electrostatic attracting part 1. The electrostatic attracting part 1, the static eliminator 16, and the surface potential meter 100 were covered with the X-ray shielding box 101.

At this time, a PI-bipolar electrostatic carrier with a diameter of 300 mm manufactured by Creative Technology Corporation was used as the electrostatic attracting part 1, and a high voltage power supply for an electrostatic chuck (CTPS-3KV2AF) capable of applying a maximum direct current voltage of ±3 KV and manufactured by Creative Technology Corporation was used as the power supply part 2. "Photo Ionizer L12645" of Hamamatsu Photonics K.K. was used as the static eliminator 16. A digital low voltage static meter (MODEL KSD-3000) manufactured by KASUGA DENKI, Inc. was used as the surface potential meter 100, and a box made of PVC (polyvinyl chloride) was used as the X-ray shielding box 101.

In the experiment, a predetermined voltage was applied to the electrodes 11, 12 of the electrostatic attracting part 1 from the power supply part 2, and the static eliminator 16 was operated for 5 minutes, and a change in surface potential of the surface 1a of the electrostatic attracting part 1 was measured by the surface potential meter 100.

As the first experimental measurement, the surface potential immediately above the positive electrode 11 and the surface potential immediately above the negative electrode 12 were measured for 5 minutes with voltages of ±300 V applied to the electrodes 11, 12 of the electrostatic attracting part 1.

According to this measurement result, as shown by a curve R1 of FIG. 19, the surface potential immediately above the positive electrode 11 was initially +240 V but gradually decreased to −60 V after 5 minutes. As shown by a curve R2 of FIG. 19, the surface potential immediately above the negative electrode 12 was initially −330 V but gradually increased to −40 V after 5 minutes.

As the second experimental measurement, the surface potential immediately above the negative electrode 12 was measured for 5 minutes with voltages of ±500 V applied to the electrodes 11, 12. As shown by a curve R3 of FIG. 19, the surface potential immediately above the negative electrode 12 was initially −530 V but gradually increased to −70 V after 5 minutes.

Thereafter, as the third, fourth, and fifth experimental measurements, voltages of ±1000 V, ±1500 V, and ±2000 V were respectively applied to the electrodes 11, 12. In each voltage state, the surface potential immediately above the negative electrode 12 was measured for 5 minutes.

Then, in the third experimental measurement, a result was obtained that the surface potential immediately above the negative electrode 12 was gradually increased from −1040 V to −90 V as shown by a curve R4. Results were obtained that, in the fourth experimental measurement, the surface potential immediately above the negative electrode 12 was gradually increased from −1600 V to −150 V as shown by a curve R5, and in the fifth experimental measurement, the surface potential immediately above the negative electrode 12 was gradually increased from −1980 V to −290 V as shown by a curve R6.

From the foregoing experimental results, the inventor has confirmed that a desired amount of static elimination can be obtained in a short time by using the static elimination method using the static eliminator 16. That is, according to this method, the amount of static elimination per unit time is large, so that the static elimination operating time can be shortened.

Further, occurrences such as wear or contamination of the surface 1a of the electrostatic attracting part 1 and the generation of particles did not occur during the experiment. From this point, it has been confirmed that even the semiconductor substrate in which contamination by particles becomes a problem can be charge-neutralized reliably by using this static elimination method.

Figure 20:
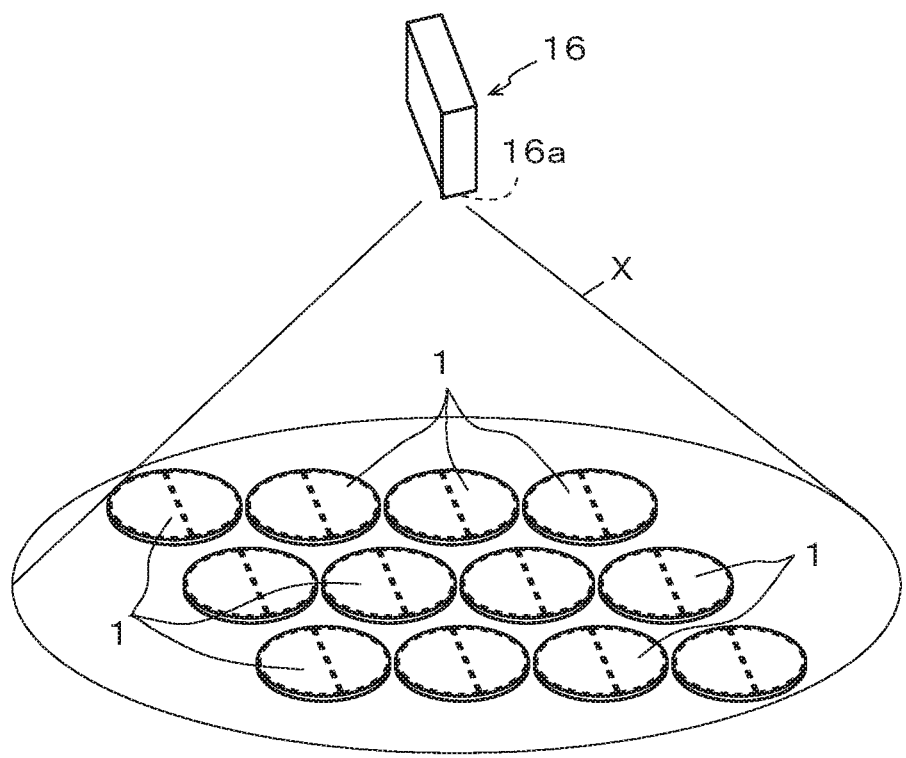
FIG. 20 is a perspective view showing a batch processing.

In the static eliminator 16 applied to the electrostatic workpiece-holding method of this embodiment, as shown in FIG. 20, a very weak X-ray can be applied at a wide angle to subject a large number of electrostatic attracting parts 1 to static elimination processing. That is, the static elimination processing on a batch basis becomes possible and work efficiency can be improved.

Figure 21:
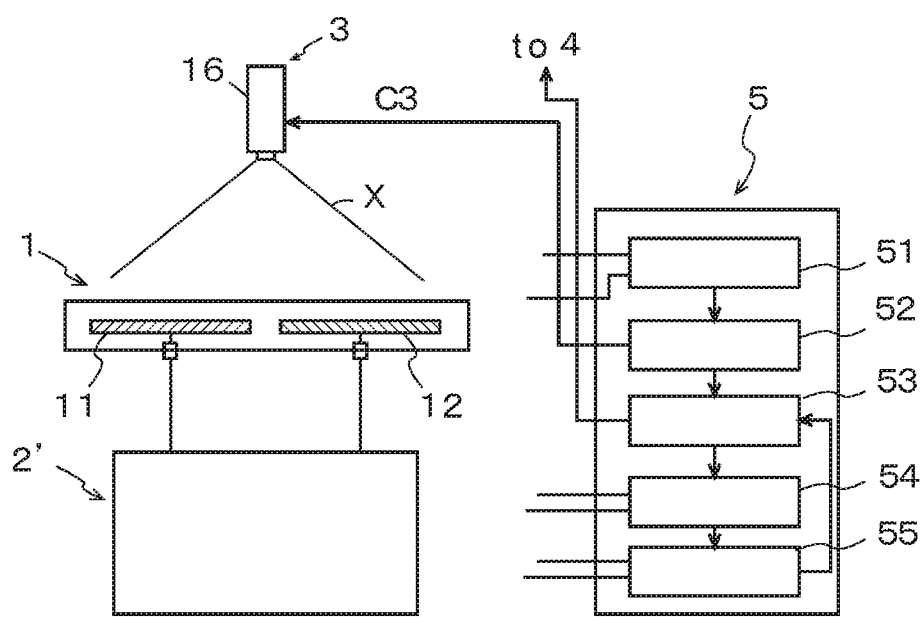
FIG. 21 is a block diagram showing an example in which the static eliminator is applied to an electrostatic workpiece-holding system.

Further, the static eliminator 16 applied in this embodiment can be applied to an electrostatic workpiece-holding system. Specifically, as shown in FIG. 21, the static eliminator 16 is used as the static eliminating part 3, and the control signal C3 is output from the static elimination driving part 52 of the control part 5 to the static eliminator 16, whereby the static eliminator 16 is controlled.

Other configurations, operations and effects are the same as those of the foregoing first to third embodiments, and their description is omitted.

The present invention should not be limited to the foregoing embodiments, and various modifications and changes can be made within the scope of the gist of the present invention.

For example, the electrodes 11, 12, 11', 12' are made of carbon ink in the foregoing embodiments. However, without being limited thereto, the electrodes 11, 12, 11', 12' can be made of, for example, a conductive material (foil or paste) having copper, SUS, iron, nickel, silver, or platinum, etc., as the main component or mixed therewith.

Further, polyimide resin is applied as the material of the dielectric 10 in the foregoing embodiments. However, without being limited thereto, resin such as vinyl chloride and ceramic such as alumina or aluminum nitride can also be applied as the material of the dielectric 10.

Figure 22:
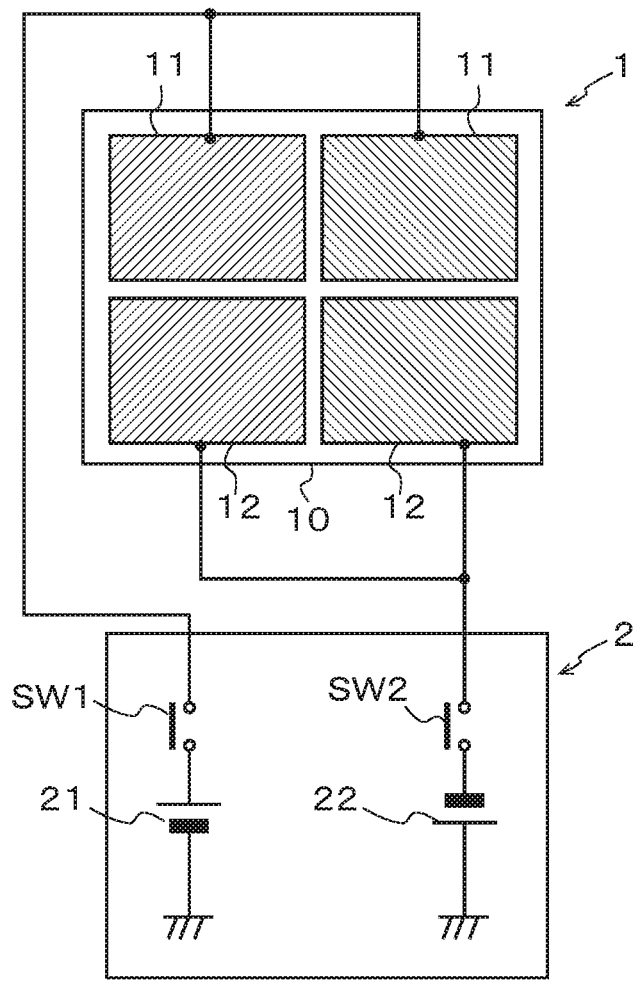
FIG. 22 is a plan view showing a modification of the electrostatic attracting part, shown with electrodes exposed.
Figure 23:
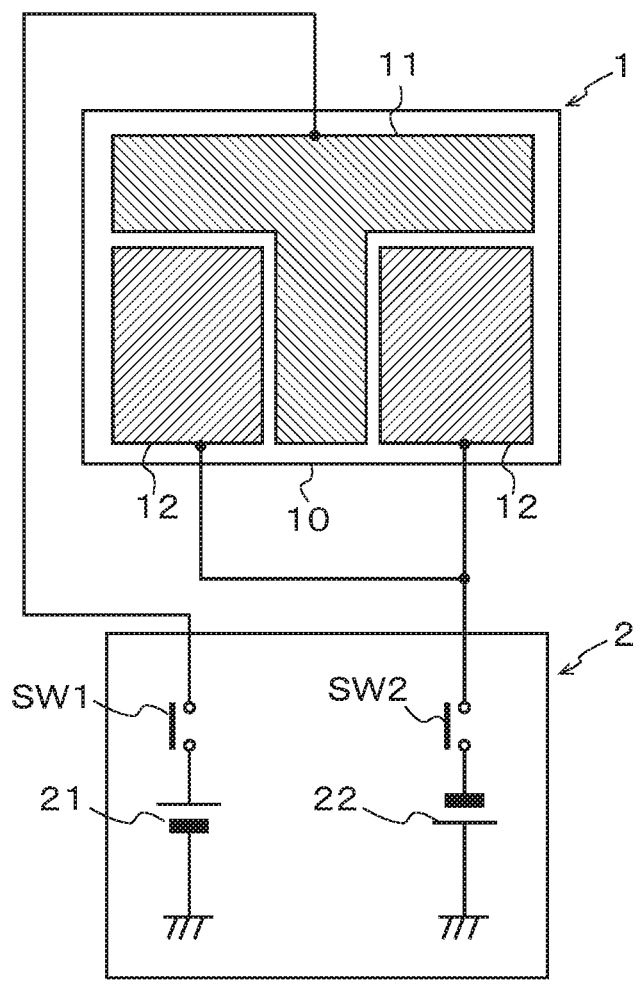
FIG. 23 is a plan view showing another modification of the electrostatic attracting part, shown with electrodes exposed.

Furthermore, the electrostatic attracting part 1 having one electrode 11 (11') as the first electrode and one electrode 12 (12') as the second electrode is exemplified in the foregoing embodiments. However, the number of the first and second electrodes should not be limited to one each. An electrostatic attracting part 1 with a plurality of electrodes 11 and a plurality of electrodes 12 arranged side by side as shown in FIG. 22, and an electrostatic attracting part 1 with a plurality of electrodes 12 arranged on both sides of one electrode 11 as shown in FIG. 23 are also included in the scope of the present invention.

REFERENCE SIGNS LIST

1 . . . electrostatic attracting part, 1a . . . surface, 2, 2' . . . power supply part, 3 . . . static eliminating part, 4 . . . workpiece setting part, 5 . . . control part, 10 . . . dielectric, 11, 12, 11', 12' . . . electrode, 11a', 12a' . . . each tooth part, 13, 14 . . . connector, 13a, 14a . . . male connector, 13b, 14b . . . female connector, 15 . . . anti-static brush, 16 . . . static eliminator, 16a . . . output window, 21, 22 . . . power supply, 23 . . . converting circuit, 23a, 23b . . . output terminal, 24 . . . inverting circuit, 25 . . . booster circuit, 25a, 25b . . . output terminal, 51 . . . initializing part, 52 . . . static elimination driving part, 53 . . . workpiece abutting part, 54 . . . workpiece attracting part, 55 . . . workpiece releasing part, 100 . . . surface potential meter, 101 . . . X-ray shielding box, C1 . . . ON control signal, C2 . . . OFF control signal, C3-C5 . . . control signal, d1, d2 . . . interval, P . . . neutral particle, $P^+$ . . . positive ion, $P^-$ . . . negative ion, Q1-Q5 . . . command signal, $Q^+$ . . . positive charge, $Q^-$ . . . negative charge, S . . . predetermined place, S1 . . . initialization step, S2 . . . static elimination step, S3 . . . workpiece setting step, S4 . . . workpiece attracting step, S5 . . . workpiece release step, SW1, SW2 . . . switch, W . . . workpiece, Wa . . . back surface, X . . . very weak X-ray.

The invention claimed is:

1. An electrostatic workpiece-holding method for holding a workpiece, by an electrostatic attraction force, on a surface of an electrostatic attracting part formed of one or more first electrodes capable of applying a positive voltage, one or more second electrodes capable of applying a negative voltage, and a dielectric covering these first and second electrodes, comprising:
an initialization step of applying a positive voltage to the first electrode(s) and applying a negative voltage to the second electrode(s);
a static elimination step of eliminating charges on the surface of the electrostatic attracting part after the execution of the initialization step;
a workpiece setting step of abutting a workpiece against the surface of the electrostatic attracting part after the execution of the static elimination step;
a workpiece attracting step of interrupting the application of the positive voltage to the first electrode(s) and the application of the negative voltage to the second electrode(s) after the execution of the workpiece setting step; and
a workpiece release step of applying a positive voltage to the first electrode(s) and applying a negative voltage to the second electrode(s) after the execution of the workpiece attracting step.

2. The electrostatic workpiece-holding method according to claim 1, wherein the static elimination step eliminates the charges on the surface of the electrostatic attracting part by applying a very weak X-ray to a gas around the electrostatic attracting part and ionizing the gas.

3. The electrostatic workpiece-holding method according to claim 1, wherein the first and second electrodes of the electrostatic attracting part are either flat plate-shaped electrodes juxtaposed so as to adjoin each other at a predetermined interval or comb-shaped electrodes arranged so as to mesh with each other at a predetermined interval.

4. An electrostatic workpiece-holding system comprising an electrostatic attracting part formed of one or more first electrodes capable of applying a positive voltage, one or more second electrodes capable of applying a negative voltage, and a dielectric covering these first and second electrodes, a power supply part capable of applying a positive voltage to the first electrode(s) and applying a negative voltage to the second voltage(s), a static eliminating part eliminating charges on a surface of the electrostatic attracting part, a workpiece setting part capable of abutting a workpiece against the surface of the electrostatic attracting part and taking out the workpiece from the surface of the electrostatic attracting part, and a control part controlling the workpiece setting part, the static eliminating part, and the power supply part, wherein
the control part comprises
an initializing part turning on the power supply part;
a static elimination driving part driving the static eliminating part after the actuation of the initializing part;
a workpiece abutting part driving the workpiece setting part to abut the workpiece against the surface of the electrostatic attracting part after the actuation of the static elimination driving part;
a workpiece attracting part turning off the power supply part after the actuation of the workpiece abutting part; and a workpiece releasing part turning on the power supply part and driving the workpiece setting part to take out the workpiece from the electrostatic attracting part after the actuation of the workpiece attracting part.

5. The electrostatic workpiece-holding system according to claim 4, wherein the static eliminating part is a static eliminator for eliminating the charges on the surface of the electrostatic attracting part by applying a very weak X-ray to a gas around the electrostatic attracting part and ionizing the gas.

6. The electrostatic workpiece-holding system according to claim 4, wherein the first and second electrodes of the electrostatic attracting part are either flat plate-shaped electrodes juxtaposed so as to adjoin each other at a predetermined interval or comb-shaped electrodes arranged so as to mesh with each other at a predetermined interval.

7. A workpiece-holding device, comprising:
an electrostatic attracting part attracting a workpiece on a surface thereof, and including a first electrode, a second electrode, and a dielectric covering the first electrode and the second electrode, and
a static eliminator for ionizing a gas around the electrostatic attracting part to thereby eliminate charges on the surface of the electrostatic attracting part,
wherein the first electrode and the second electrode are flat plate-shaped electrodes juxtaposed so as to adjoin each other at a predetermined interval,
the surface of the electrostatic attracting part above the first electrode is negatively charged and the surface of the electrostatic attracting part above the second electrode is positively charged with potentials of the first electrode and the second electrode maintained at 0 volts, and after the charges on the surface of the electrostatic attracting part is eliminated, a positive charge is charged on the workpiece above the first electrode and a negative charge is charged on the workpiece above the second electrode, whereby the workpiece is attracted to the electrostatic attracting part in an electrostatic induction state in which an inside of the workpiece has an electric field of zero.

8. The workpiece-holding device according to claim 7, wherein the workpiece is attracted to the electrostatic attracting part by a Coulomb force.

9. The workpiece-holding device according to claim 7, wherein the workpiece is a conductor or a semiconductor.

10. A workpiece-holding device, comprising:
an electrostatic attracting part attracting a workpiece to a surface of the electrostatic attracting part, and including a first electrode, a second electrode, and a dielectric covering the first electrode and the second electrode, and
a static eliminator for ionizing a gas around the electrostatic attracting part to thereby eliminate charges on the surface of the electrostatic attracting part,
wherein the first electrode and the second electrode are comb-shaped electrodes arranged so as to mesh with each other at a predetermined interval,
the surface of the electrostatic attracting part above each tooth part of the first electrode is positively charged and the surface of the electrostatic attracting part above each tooth part of the second electrode is negatively charged with potentials of the first electrode and the second electrode maintained at 0 volts, and after the charges on the surface of the electrostatic attracting part is eliminated, a negative charge is charged on the workpiece above the each tooth part of the first electrode and a positive charge is charged on the workpiece above the each tooth part of the second electrode, whereby the workpiece is attracted to the electrostatic attracting part with an inside of the workpiece in a dielectric polarization state.

11. The workpiece-holding device according to claim 10, wherein the workpiece is attracted to the electrostatic attracting part by a gradient force.

12. The workpiece-holding device according to claim 10, wherein the workpiece is a conductor, a semiconductor, or an insulator.

13. The workpiece-holding device according to claim 7, wherein the dielectric is made of resin or ceramic.

14. The workpiece-holding device according to claim 7, wherein the static eliminator is disposed above the electrostatic attracting part, and applies an X-ray to the gas around the electrostatic attracting part to ionize the gas.

15. The workpiece-holding device according to claim 10, wherein the static eliminator is disposed above the electrostatic attracting part, and applies an X-ray to the gas around the electrostatic attracting part to ionize the gas.

* * * * *